United States Patent
Kim et al.

(10) Patent No.: US 7,688,417 B2
(45) Date of Patent: Mar. 30, 2010

(54) THIN FILM TRANSISTOR ARRAY PANEL AND METHOD FOR MANUFACTURING THE SAME

(75) Inventors: Sang-Gab Kim, Seoul (KR); Min-Seok Oh, Gyeonggi-do (KR); Hong-Kee Chin, Gyeonggi-do (KR); Jeong-Min Park, Seoul (KR); Shi-Yul Kim, Gyeonggi-do (KR); Hee-Hwan Choe, Incheon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 796 days.

(21) Appl. No.: 11/255,801

(22) Filed: Oct. 21, 2005

(65) Prior Publication Data

US 2006/0131581 A1    Jun. 22, 2006

(30) Foreign Application Priority Data

Dec. 17, 2004  (KR) ...................... 10-2004-0108174

(51) Int. Cl.
G02F 1/1333    (2006.01)
G02F 1/133     (2006.01)
G02F 1/13      (2006.01)

(52) U.S. Cl. .................. 349/158; 349/116; 349/187

(58) Field of Classification Search .................. 349/187, 349/158, 116
See application file for complete search history.

(56) References Cited

U.S. PATENT DOCUMENTS

| 6,022,753 A | * | 2/2000 | Park et al. ...................... 438/30 |
| 6,037,084 A | * | 3/2000 | Ting et al. ....................... 430/7 |
| 6,255,130 B1 | * | 7/2001 | Kim .............................. 438/30 |
| 6,451,635 B2 | * | 9/2002 | Park et al. ..................... 438/158 |
| 6,787,275 B2 | * | 9/2004 | Kawase .......................... 430/7 |
| 2004/0125313 A1 | | 7/2004 | Lim | |

FOREIGN PATENT DOCUMENTS

| JP | 08-172202 | 7/1996 |
| JP | 2002-350899 | 12/2002 |
| JP | 2004-212933 | 7/2004 |
| KR | 1020000001757 | 1/2000 |
| KR | 1020010045360 | 6/2001 |
| KR | 1020010066256 | 7/2001 |
| KR | 1020020034284 | 5/2002 |
| KR | 1020020042924 | 6/2002 |

(Continued)

*Primary Examiner*—Mike Qi
(74) *Attorney, Agent, or Firm*—Innovation Counssel LLP

(57) ABSTRACT

A method for manufacturing a TFT array panel including forming a gate line having a gate electrode on a insulating layer, a gate insulating layer on the gate line, a semiconductor on the gate insulating layer, an ohmic contact on the semiconductor, a data line having a source electrode and a drain electrode apart form the source electrode on the ohmic contact, a passivation layer having a contact hole to expose the drain electrode, and a pixel electrode connected to the drain electrode through the contact hole. The drain electrode and the source electrode are formed by a photolithography using a negative photoresist pattern. The negative photoresist pattern includes a first portion having a first thickness corresponding to a channel area, a second portion having a second thickness corresponding to a data line area, and a third portion having a third thickness corresponding to another area.

9 Claims, 32 Drawing Sheets

FOREIGN PATENT DOCUMENTS

| | | |
|---|---|---|
| KR | 1020020057224 | 7/2002 |
| KR | 1020020091682 | 12/2002 |
| KR | 1020040041491 | 5/2004 |
| KR | 100436181 | 6/2004 |
| KR | 1020040066282 | 7/2004 |
| KR | 1020040085302 | 10/2004 |

* cited by examiner

THIN FILM TRANSISTOR ARRAY PANEL AND METHOD FOR MANUFACTURING THE SAME

CROSS-REFERENCE TO RELATED APPLICATION

This application claims priority to Korean Patent Application No. 2004-0108174 filed on Dec. 17, 2004, the disclosure of which is hereby incorporated herein by reference in its entirety for all purposes.

BACKGROUND

1. Field of the Invention

The present invention relates generally to a thin film transistor (TFT) array panel for liquid crystal displays (LCDs) and a method of fabricating the same.

2. Description of Related Art

A liquid crystal display (LCD) is one of the most widely used flat panel displays. An LCD includes two panels provided with field-generating electrodes and a liquid crystal (LC) layer interposed therebetween. The LCD displays images by applying voltages to the field-generating electrodes to generate an electric field in the LC layer, which determines orientations of LC molecules in the LC layer to adjust polarization of incident light.

Typically, one panel has pixel electrodes arranged in a matrix type, while the other panel has a common electrode which covers the whole surface of the other panel. The LCD displays images by applying a separate voltage to each pixel electrode, with each pixel electrode connected to a TFT to control the voltage for each pixel electrode. The TFT is connected to a gate line, which transmits a gate signal, and a data line that transmits a data signal. In general, the TFT is a switching device for controlling a voltage (display) signal supplied to each pixel electrode.

Conventionally, photolithography with masks is used repeatedly to pattern multiple thin film layers and to form the TFT. Different laminated layers having different shapes may be formed by photolithography using one mask, rather than a number of masks, to decrease manufacturing costs. However, when different laminated layers are patterned by photolithography using one mask (e.g., photolithography process using a photoresist pattern as an etching mask), a patterned upper layer can be consumed during patterning of an underlying layer (e.g., width of the thin film is narrowed or etched upon patterning a thin film). A design for broadening the width of the overlying layer may solve this problem, but decreases the size of display area or reduces the aperture of pixels.

SUMMARY

The present invention provides a TFT array panel and a method for manufacturing thereof, which may increase a display area or provide a more desirable aperture of pixels that may also have low resistivity. In an exemplary method of manufacturing a TFT array panel according to the present invention, the method includes forming a gate line having a gate electrode on an insulating substrate, forming a gate insulating layer on the gate line, forming a semiconductor on the gate insulating layer, forming an ohmic contact on the semiconductor, forming on the ohmic contact a data line having a source electrode and a drain electrode apart from the source electrode by a photolithography using a negative photoresist pattern, forming a passivation layer having a contact hole to expose the drain electrode and forming a pixel electrode connected to the drain electrode through the contact hole.

The negative photoresist pattern includes a first portion having a first thickness corresponding to a channel area between the source electrode and the drain electrode, a second portion having a second thickness thicker than the first thickness corresponding to a data line area and the drain electrode, and a third portion having a third thickness thinner than the first thickness (e.g., corresponding to areas other than channel area, the data line area, and the drain electrode). A photomask used in the photolithography may include a semi-transparent part to partly transmit light, a transparent part to fully transmit light, and an opaque part to block light. The semi-transparent part, the transparent part, and the opaque part may correspond to the first portion, the second portion, and the third portion, respectively, during an exposure process.

The semi-transparent part may include a pattern that is smaller than the resolution of a light exposure device. The pattern can be at least one of a slit, a circle, a polygonal shape (e.g., a square), and a plurality of slits that are bar shaped. The data line, the drain electrode, the ohmic contact, and the semiconductor can be formed by utilizing a single photomask.

In an exemplary TFT array panel according to this present invention, a TFT includes a substrate, a gate line formed on the substrate, a gate insulating layer formed on the gate line, a semiconductor formed on the gate insulating layer, a data line having a source electrode and a drain electrode spaced apart from the source electrode, a passivation layer formed on the data line, the drain electrode, and the semiconductor, and a pixel electrode connected the drain electrode. The edges of the data line and the drain electrode, except the edge facing the source electrode (e.g., the distance between the source electrode and the drain electrode), are disposed approximately 1.25 μm or less from the edge of the semiconductor.

BRIEF DESCRIPTION OF THE DRAWINGS

The features of the present invention will become more apparent to those of ordinary skill in the art by describing in detail exemplary embodiments thereof with reference to the attached drawings, in which.

Use of the same reference symbols in different figures indicates similar or identical items.

DETAILED DESCRIPTION

Figure 1:
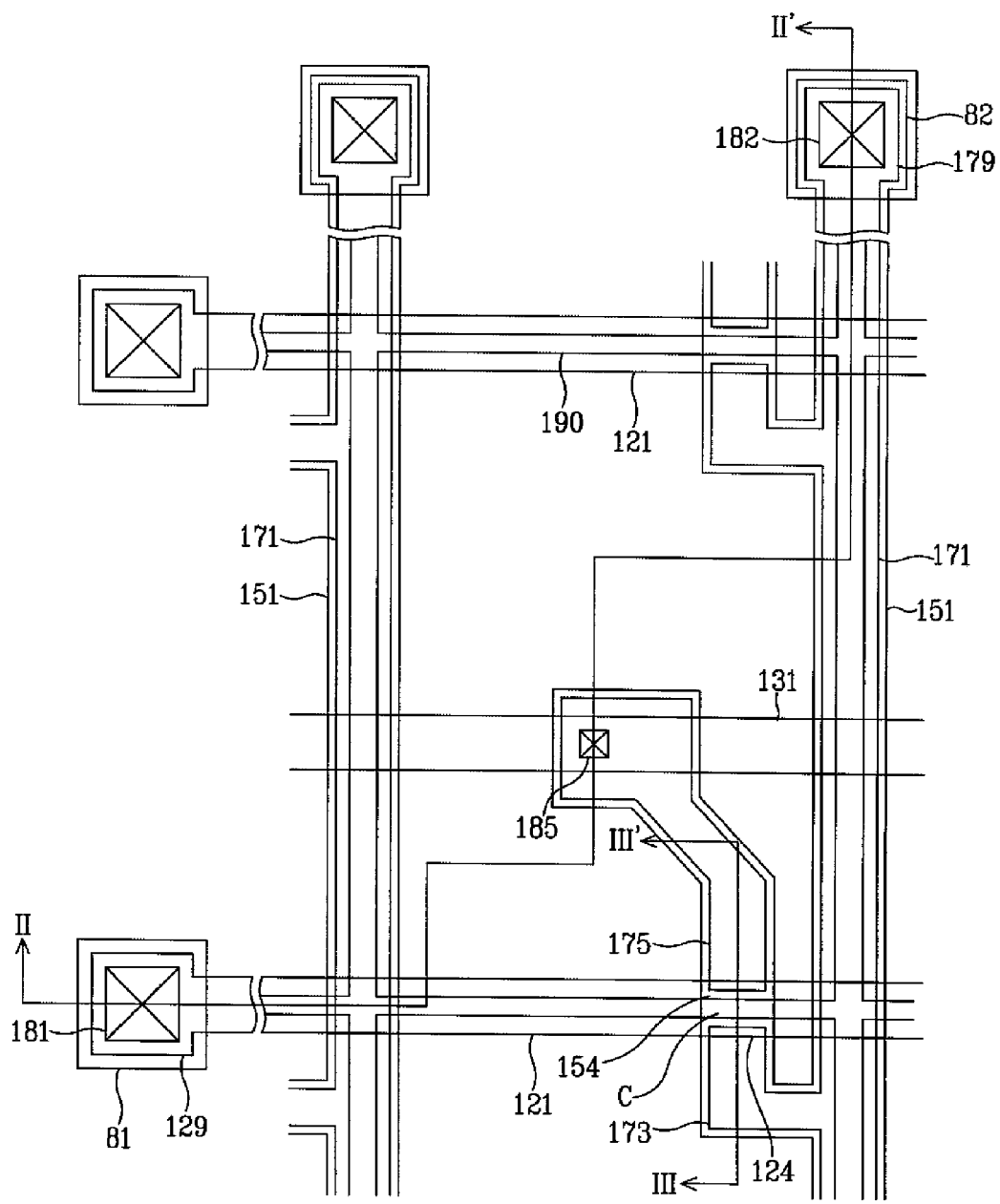
FIG. 1 is a plan view of a TFT array panel for an LCD according to an embodiment of the present invention.
Figure 2:
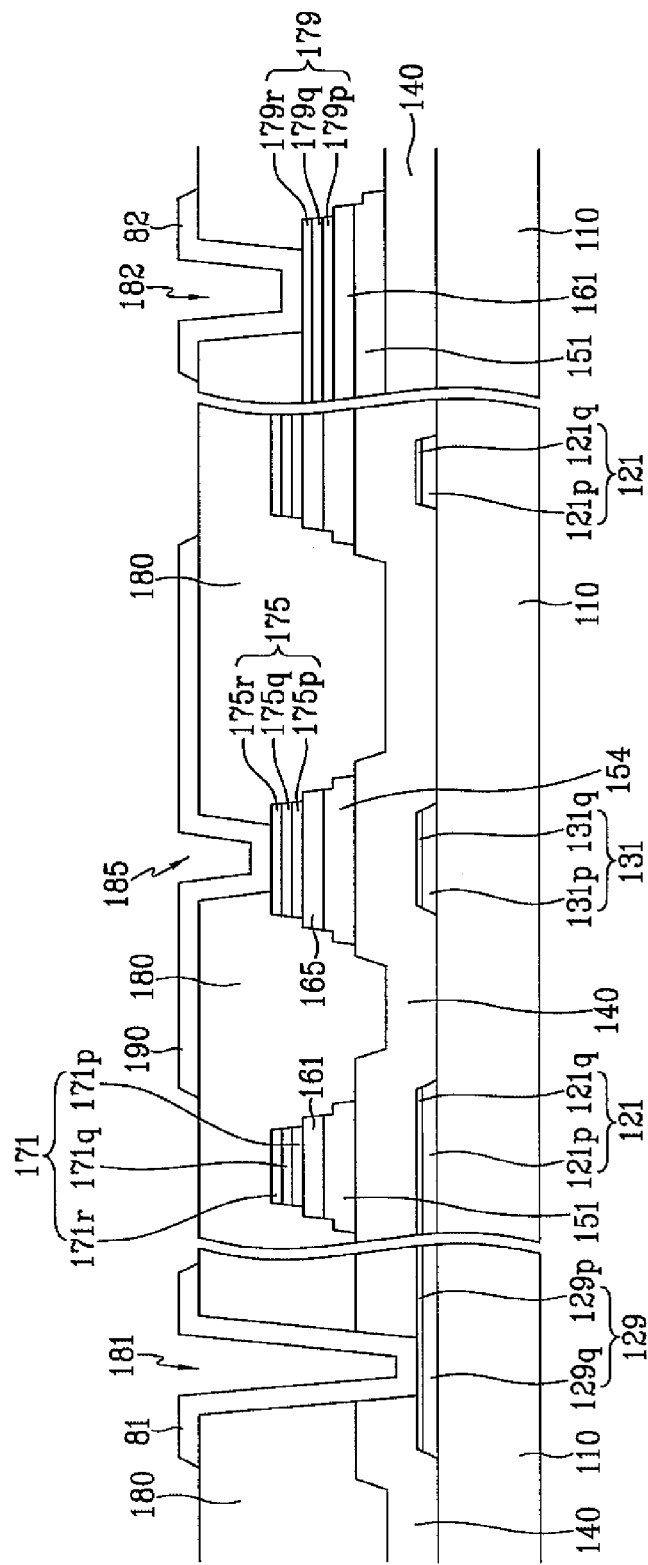
FIG. 2 is a cross-sectional view taken along the line II-II' of the TFT array panel of FIG. 1.

FIG. 1 is a plan view showing a TFT array panel according to an embodiment of the present invention, and FIG. 2 is a cross-sectional view taken along the line II-II' of FIG. 1.

Referring to FIGS. 1 and 2, a plurality of gate lines 121 for transmitting gate signals and a plurality of storage electrode lines 131 are formed on an insulating substrate 110. Gate lines 121 extend in a horizontal or transverse direction, and a portion of each gate line 121 forms a gate electrode 124. Gate electrode 124 may protrude from gate line 121. Gate line 121 includes an end portion 129 having a relatively large area for contact with an external device or an output of gate driving circuit (e.g., formed on substrate 110 or external).

A plurality of storage electrode lines 131 are formed in parallel to the gate lines 121 and electrically separated from gate lines 121. Each storage electrode line 131 overlaps a drain electrode 175 and forms a storage capacitor with a pixel electrode 190. An external voltage, such as a common voltage, is applied to the storage electrode lines 131. Storage electrode line 131 can be omitted in the case that sufficient storage capacitance exists (e.g., due to overlap of pixel electrodes 190 and gate lines 121). Also, storage electrode line 131 can be arranged in an edge portion of display area to increase display area and/or maximize aperture of pixel.

Gate line 121 and storage electrode line 131 can be formed of a metal such as Al, Cr, Ti, Ta, Mo, or alloys thereof. Gate lines 121 and storage electrode lines 131 may have a multi-layered structure including a lower film 121p and 131p, respectively, and an upper film 121q and 131q, respectively. Lower films 121p and 131p may be made of low resistivity metal including Al or Al alloys for reducing signal delay or voltage drop in gate lines 121 and the storage electrode lines 131, with a thickness in the range of 1,000 to 3,000 Å.

Upper films 121q and 131q may be made of a material such as Mo, Mo alloy (MoW alloy) or Cr, which have good physical, chemical, and electrical contact characteristics with other materials such as indium tin oxide (ITO) and indium zinc oxide (IZO). Upper films 121q and 131q may have a thickness in the range of 100 to 1,000 Å. An exemplary combination of the lower film material and the upper film material is Al or AlNd alloy and Mo, respectively. The lower and the upper film materials may be changed relative to each other.

Figure 3:
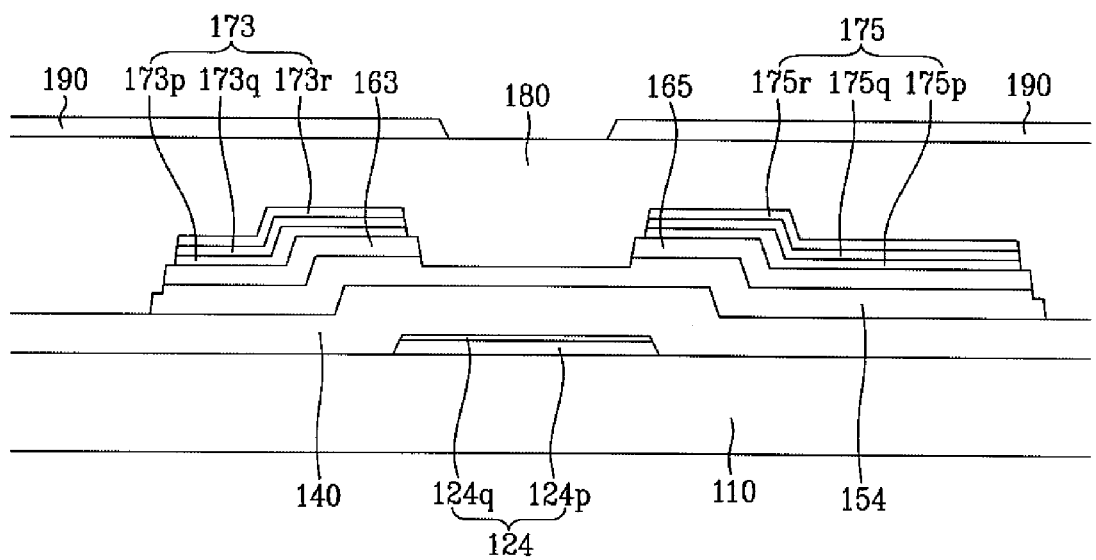
FIG. 3 is a cross-sectional view taken along the line III-III' of the TFT array panel of FIG. 1.

Referring to FIGS. 2 and 3, the numeric references are shown for lower film 121p and upper film 121q of gate line 121, lower film 124p and upper film 124q of gate electrode 124, lower film 129p and upper film 129q of end portion 129 of gate line 121, and lower film 131p and upper film 131q of storage electrode line 131. In addition, the lateral sides of lower films 121p, 124p, 129p, and 131p, and upper films 121q, 124q, 129q, and 131q are tapered, and the inclination angle of the lateral sides with respect to a surface of substrate 110 ranges from about 30 to about 80 degrees.

A gate insulating layer 140 (e.g., made of silicon nitride SiNx) is formed on gate lines 121 and storage electrode lines 131. A plurality of semiconductor stripes 151 (e.g., made of hydrogenated amorphous silicon (abbreviated to "a-Si")) are formed on gate insulating layer 140. Each semiconductor stripe 151 extends substantially in a longitudinal direction and has a plurality of projections 154 branching out toward gate electrodes 124. Projections 154 also may cover a portion of gate line 121.

A plurality of ohmic contact stripes 161 and ohmic contact islands 165 (e.g., made of silicide or n+ hydrogenated amorphous silicon highly doped with n type impurities such as phosphorous) are formed on semiconductor stripes 151. Each ohmic contact stripe 161 has a plurality of protrusions 163. Protrusions 163 and ohmic contact islands 165 are disposed on projections 154 of semiconductor stripes 151 and are spaced apart from each other with respect to gate electrodes 124. The lateral sides of semiconductors stripes 151 and ohmic contacts 161 and 165 form a taper structure and are inclined at angles in the range about 30 to 80 degrees relative to the surface of substrate 110.

A plurality of data lines 171 and drain electrodes 175 are formed on ohmic contacts 161 and 165. The data lines 171 transmit data signals and extend in a substantially longitudinal direction across gate line 121 and storage electrode line 131. Each data line 171 has a source electrode 173 branching toward drain electrode 175, with each data line 171 having an end portion 179 having a relatively large area for contact with other layers or external devices to receive a data signal from an external circuit.

Each pair of source electrodes 173 and drain electrodes 175 is separated from each other and facing each other with respect to a gate electrode 124 therebetween. The drain electrodes 175 have expansions overlapping storage electrode lines 131. A gate electrode 124, a source electrode 173, and a drain electrode 175, along with the semiconductor projection 154 form a TFT. A channel of the TFT is formed on the projection 154 between the source electrode 173 and the drain electrode 175.

The Data line 171 and the drain electrode 175 may be formed of a conductive layer including Mo, or a conductive layer including Al, and may have a single or a multi layered structure as described similarly for the gate line 121. In an exemplary embodiment, the data line 171 can have a multi layered structure including an upper layer 171r, an intermediate layer 171q, and a lower layer 171p. The upper layer 171r may be made of a material such as Mo, Mo alloy (e.g., MoW alloy or MoNb alloy) to provide a good physical, chemical, and electrical contact characteristic with other materials such as ITO or IZO. The intermediate layer 171q may be made of a low resistivity material to reduce a signal delay and a voltage drop in data lines 171, such as Al or Al alloys. The lower layer 171p may be made of a buffer material such as Mo or Mo alloy (e.g., MoW alloy or MoNb alloy) to prevent Al from entering or spreading to the semiconductor 151 or ohmic contacts 161 and 165.

The end portion 179 of the data line 171 includes an upper layer 179r, an intermediate layer 179q, and a lower layer 179p. The source electrode 173 and the drain electrode 175 include an upper layer 173r and 175r, an intermediate layer 173q and 175q, and a lower layer 173p and 175p, respectively.

Semiconductor stripel 51 has the same shape as the data line 171, the drain electrode 175, and the underlying ohmic contacts 161 and 165. However, the projections 154 of semiconductor stripe 151 include some exposed portions, which are not covered with data lines 171 and drain electrodes 175, such as the portions located between source electrodes 173 and drain electrodes 175. Thus, while the ohmic contacts 161 and 165 have the same shape as the data line 171 and the drain electrode 175, the semiconductor stripe 151 is exposed between the source electrode 173 and the drain electrode 175.

The edge of the semiconductor stripe 151 is exposed out of the edges of the data line 171 and the drain electrode 175. In general, except for the distance between source electrode 173 and drain electrode 175, the distance between the edges of the semiconductor stripe 151 and the data line 171 or the drain electrode 175 is generally less than 2 μm and preferably less than 1.25 μm.

A passivation layer 180 is formed on the data lines 171 and the drain electrodes 175, and the gate insulating layer 140 The passivation layer 180 is preferably made of a photosensitive organic material having a good flatness characteristic, or a low dielectric insulating material, such as a-Si:C:O and a-Si:O:F formed by plasma enhanced chemical vapor deposition (PECVD), or an inorganic material such as silicon nitride and silicon oxide.

The passivation layer 180 has a plurality of contact holes 185 and 182 to expose at least a portion of the drain electrodes 175 and the end portions 179 of the data lines 171 respectively. Also, a plurality of contact holes 181 for exposing the end portion 129 of the gate line 121 are formed through the passivation layer 180 and the gate insulating layer 140. The end portions 129 of gate lines 121 have contact portions for contact, for example, with an external driving circuit.

A plurality of pixel electrodes 190 and the contact assistants 81 and 82, which may be made of IZO or ITO, are formed on the passivation layer 180. Pixel electrode 190 is connected physically and electrically to the drain electrode 175 through the contact hole 185 to receive a data voltage.

The pixel electrode 190 provided with the data voltage and the other panel (not shown) having a common electrode provided with a common voltage generate an electric field in LC layer(not shown) disposed between the pixel electrode 190 and the common electrode to orient LC molecules. The pixel electrode 190 and the common electrode (not shown) form an LC capacitor (referred to as a liquid crystal capacitor), which stores applied voltages after turn-off of the TFT. A storage capacitor may be formed in parallel to the LC capacitor to enhance the capability of storing electrical charges. The storage capacitors may be implemented by overlapping the pixel electrodes 190 with adjacent gate lines 121 of the neighboring pixels (i.e., previous gate lines) or with the storage electrode lines 131. The pixel electrodes 190 can also overlap the neighboring gate lines 121 and data lines 171 to increase the size of display area (e.g., increase the aperture), but the overlapping is optional.

The contact assistants 81 and 82 are connected to the end portions 129 and 179 of the gate lines 121 and the data lines 171, respectively, through the contact holes 181 and 182, respectively. The contact assistants 81 and 82 protect the end portions 129 and 179, and enhance adhesion of the end portions 129 and 179 with external devices. The contact assistants 81 and 82 are optional elements and can be connected to external devices through an anisotropic conductive film (not shown) or, if integrated at the TFT array panel 100, to the wire lines of a corresponding integrated gate driving circuit or a corresponding integrated data driving circuit.

In another exemplary embodiment, the pixel electrode 190 may be made of a transparent conductive polymer or an opaque reflective metal for a reflective LCD. In these cases, the contact assistants 81 and 82 can be formed of a different material from the pixel electrode, such as IZO or ITO.

Hereinafter, a method for fabricating the TFT array panel of FIGS. 1 to 3 will be described in detail by referring to FIGS. 4 to 13B and FIGS. 1 to 3.

Figure 4:
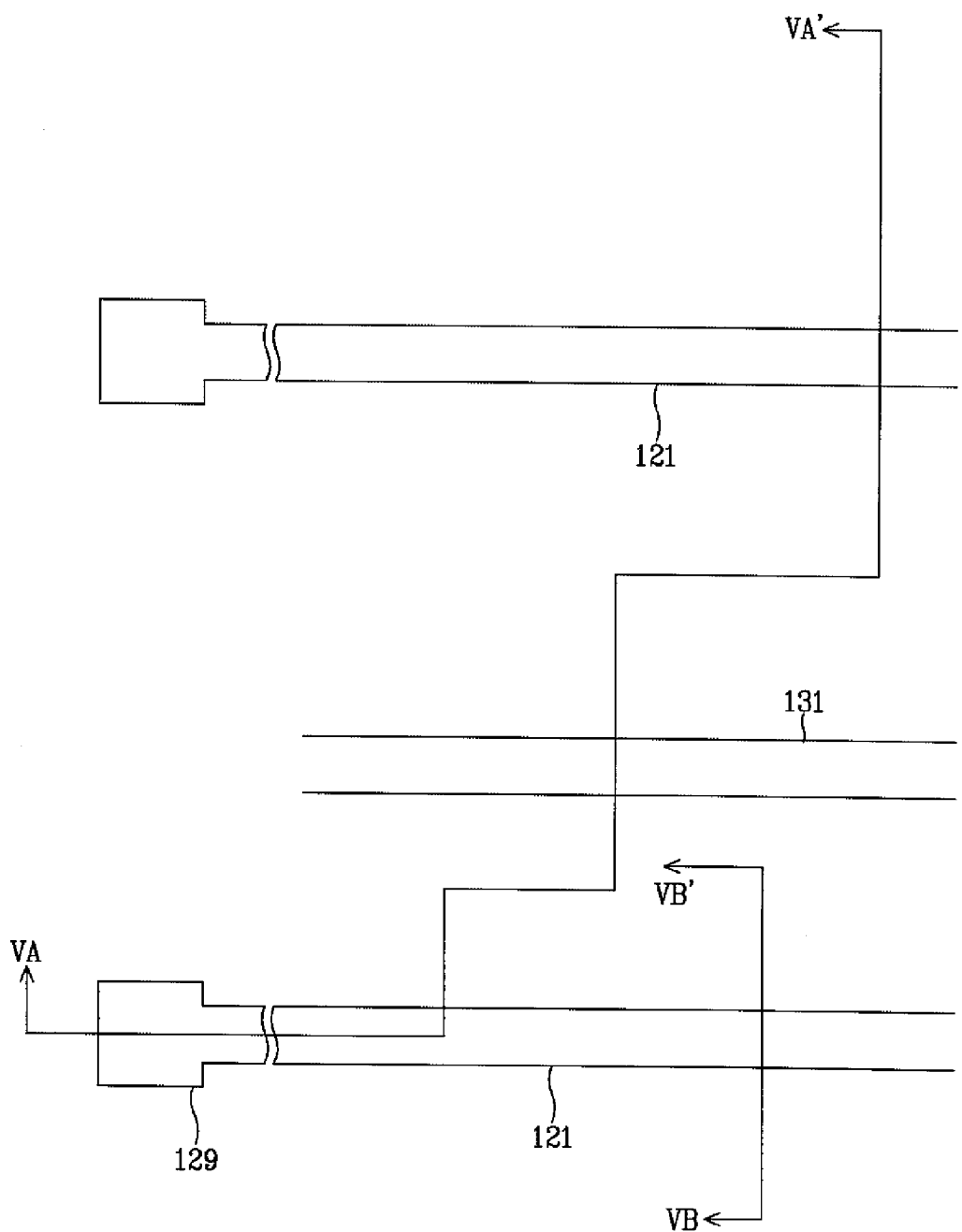
FIG. 4 is a plan view for explaining a step of fabricating a TFT array panel according to an embodiment of the present invention.
Figure 5A:
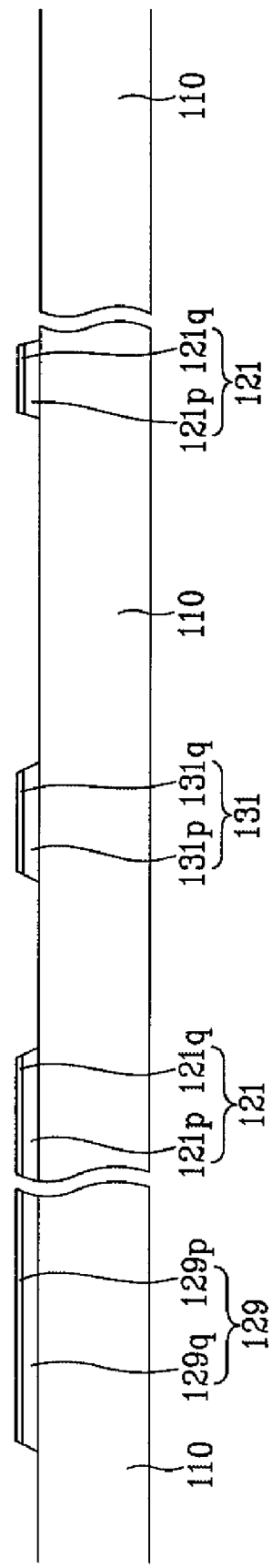
FIGS. 5A and 5B are cross-sectional views taken along the lines VA-VA' and VB-VB' respectively of the TFT array panel of FIG. 4.
Figure 5B:
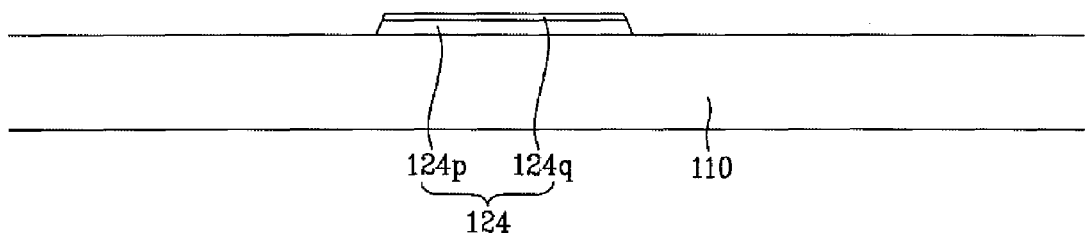

As shown in FIGS. 4 and 5B, a lower film including Al or Al alloy (e.g., AlNd) and an upper film including Mo or Mo alloy are sequentially formed (e.g., by sputtering) on an insulating substrate 110 such as glass. The thickness of the lower film is about 1000 to 3000 Å, and the thickness of the upper film is about 500 to 1000 Å. The lower and upper layers are patterned in sequence (e.g., by a photolithography process using a photoresist pattern such as an etch mask) to form a plurality of gate lines 121 having a plurality of gate electrodes 124 and a storage electrode line 131. The patterned upper film 121q and 131q and lower film 121p and 131p can be formed by a wet etch process using a solution including $CH_3COOH$, $HNO_3$, $H_3PO_4$, and $H_2O$ for etching simultaneously both Al and Mo and having the lateral sides thereof tapered.

Figure 6A:
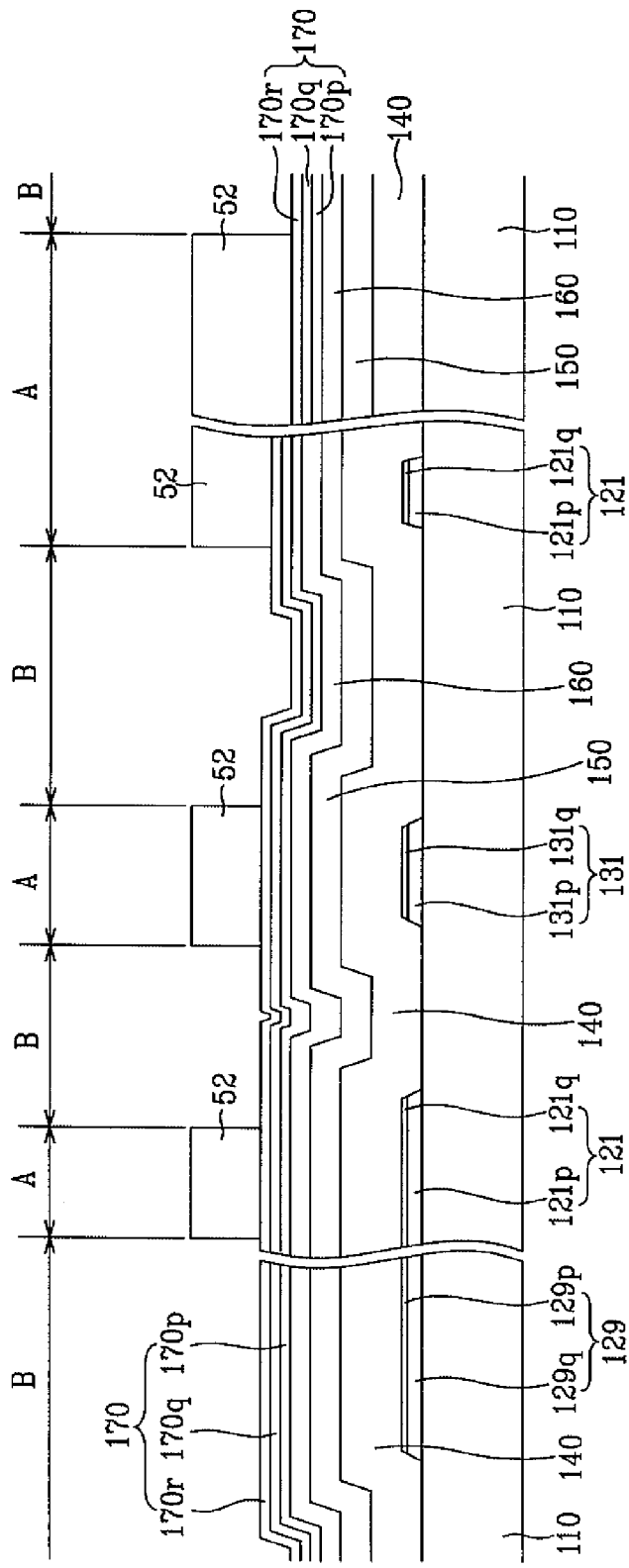
FIGS. 6A and 6B are cross-sectional views showing the steps following those discussed in reference to FIGS. 5A and 5B respectively.
Figure 6B:
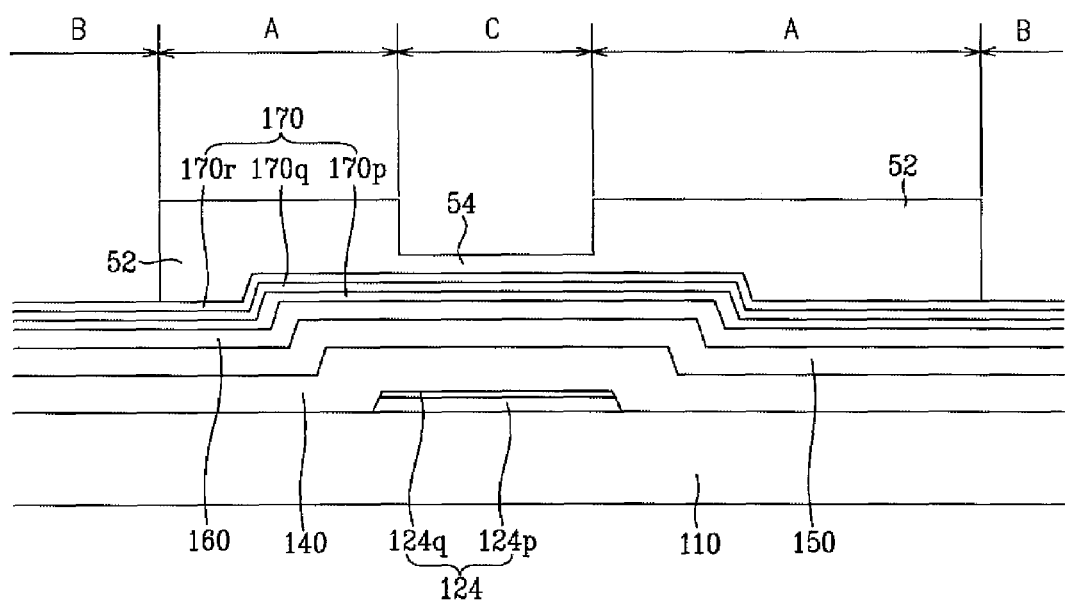

Referring to FIGS. 6A and 6B, a gate insulating layer 140 having about 1500 to 5000 Å thickness, an intrinsic amorphous silicon layer 150 having about 500 to 2000 Å, and a doped amorphous silicon layer (extrinsic a-Si) 160 having about 300 to 600 Å are formed consecutively by a method such as chemical vapor deposition. A conductive film 170 including a lower layer 170p formed of Mo, an intermediate layer 170q formed of Al, and an upper layer 170r formed of Mo is formed on the doped amorphous silicon layer 160 by sputtering. A negative photoresist is coated to a thickness of about 1 μm to 2 μm on the conductive film 170 and is patterned by photolithography to form a negative photoresist pattern 52 and 54 (i.e., exposure of the negative photoresist through a photomask to a light and development of the negative photoresist).

While a portion of the negative photoresist exposed to light penetrating through a transparent part of the photomask remains after developing, a portion of negative photoresist blocked from light by an opaque part of the photomask is removed by developing. A positive photoresist may be employed, but does not provide a drastic sidewall inclination angle as provided by the negative photoresist method. For example, the negative photoresist patterns 52 and 54 have steep lateral sides of approximately 90 degrees with respect to a surface.

The upper and the lower portion of the photoresist corresponding to the border of the transparent area and the opaque area of the photomask are exposed to relatively different amounts of light during a relatively long exposure process. That is, the upper portion is exposed to more light than the lower portion. Therefore, the positive photoresist exposed to light is removed and has a gentle slope, but the negative photoresist exposed to light remains and has a steep slope closer to 90 degrees or an inverse (or reversal) tapered slope because the portions exposed to light remains.

Figure 14A:
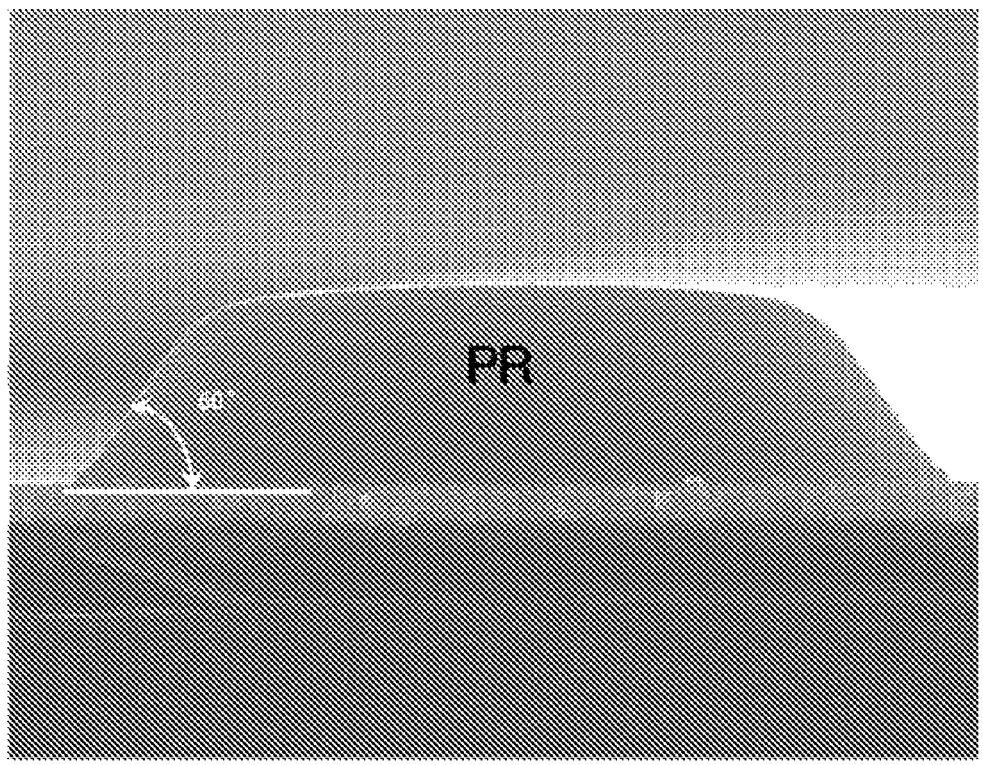
FIG. 14A is a scanning electron microscope picture taken of a positive photoresist patterned by photolithography.
Figure 14B:
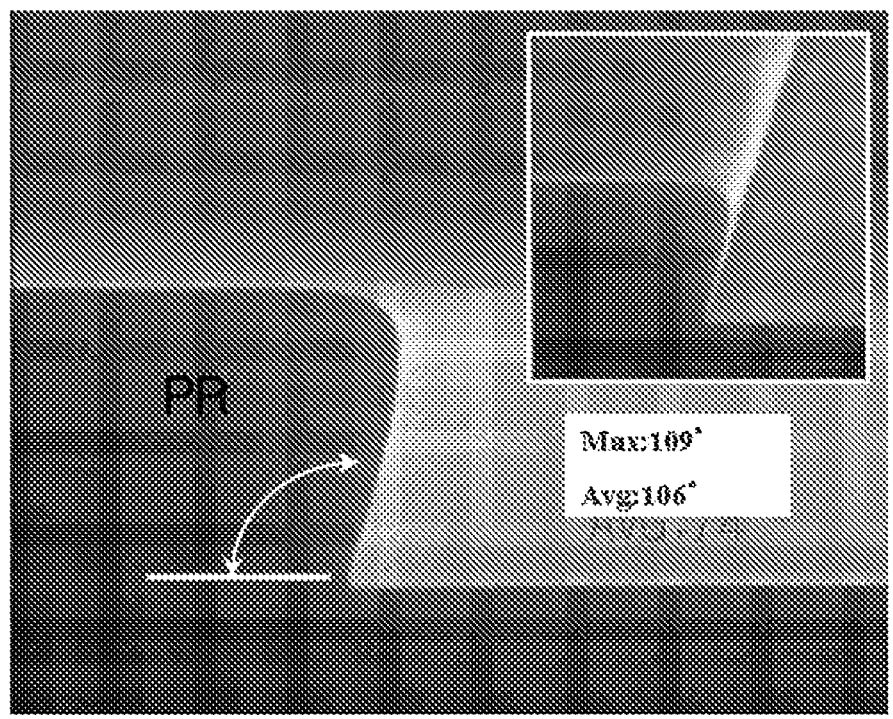
FIG. 14B is a scanning electron microscope picture taken of a negative photoresist patterned by photolithography.

Referring to FIG. 14A, a lateral side of a positive photoresist pattern PR1 is measured to have 60 degree slope after exposing the positive photoresist to light and developing. On the other hand, referring to FIG. 14B, a lateral side of a negative photoresist pattern PR2 is measured to have more than a 90 degree slope, (i.e., an inverse tapered slope).

Referring to FIGS. 6A and 6B, a photoresist pattern includes a plurality of first and second portions 52 and 54 having different thickness (i.e., a thickness of the developed photoresist varies depending upon position).

Second portions 54 are located on channel areas (labeled "C") of a TFT and have a thickness less than the thickness of first portions 52 located on data line areas (labeled "A" and also referred to as wire areas). The portions of the photoresist film on the remaining areas (labeled "B") are removed or have a very small thickness (e.g., substantially zero) to expose underlying portions of conductive layer 170). The thickness ratio of the second portions 54 on the channel areas C to the first portions 52 on the data line areas A is adjusted depending upon the etching conditions in the subsequent etching steps. In general, it is preferable that the thickness of second portions 54 is equal to or less than half the thickness of first portions 52. For example, the thickness of the second portions 54 is preferably less than 4000 Å.

The position-dependent thickness of the photoresist film is obtained by several techniques, such as, for example, by providing semi-transparent areas corresponding to second portions 54 on the photomask as well as transparent areas and opaque areas. The semi-transparent areas alternatively have a slit pattern, a lattice pattern, and/or a thin film(s) with intermediate transmittance or intermediate thickness. When using a slit pattern, it is preferable that the width of the slits or the distance between the slits is smaller than the resolution of a light exposure device used for the photolithography. Another example is to use reflowable photoresist. That is, once a photoresist pattern made of a reflowable material is formed by using a normal photomask having only transparent areas and opaque areas, the photoresist pattern is subject to a reflow process to flow onto areas without the photoresist, thereby forming thin portions.

Figure 10:
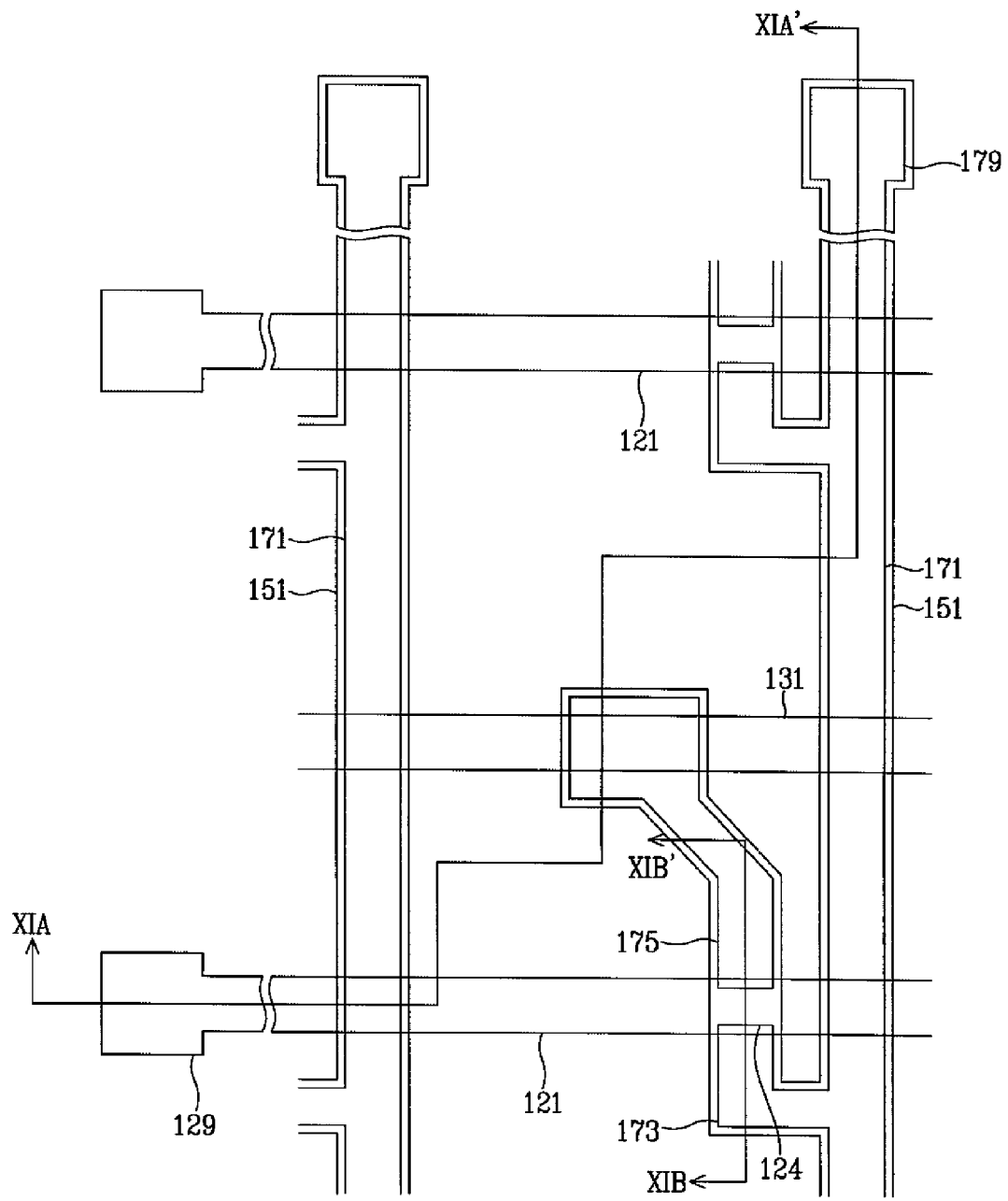
FIG. 10 is a plan view showing the steps following those discussed in reference to FIGS. 9A and 9B of fabricating a TFT array panel according to an embodiment of this present invention.
Figure 11A:
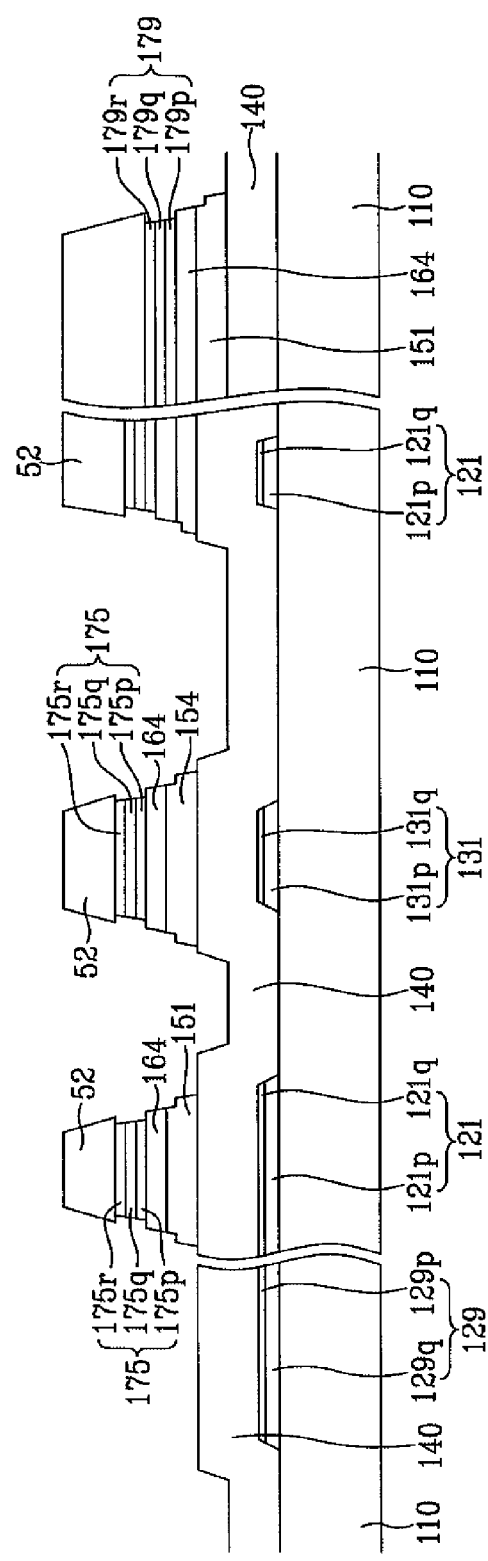
FIGS. 11A and 11B are cross-sectional views taken along the lines of XIA-XIA' and XIB-XIB' respectively of FIG. 10.
Figure 11B:
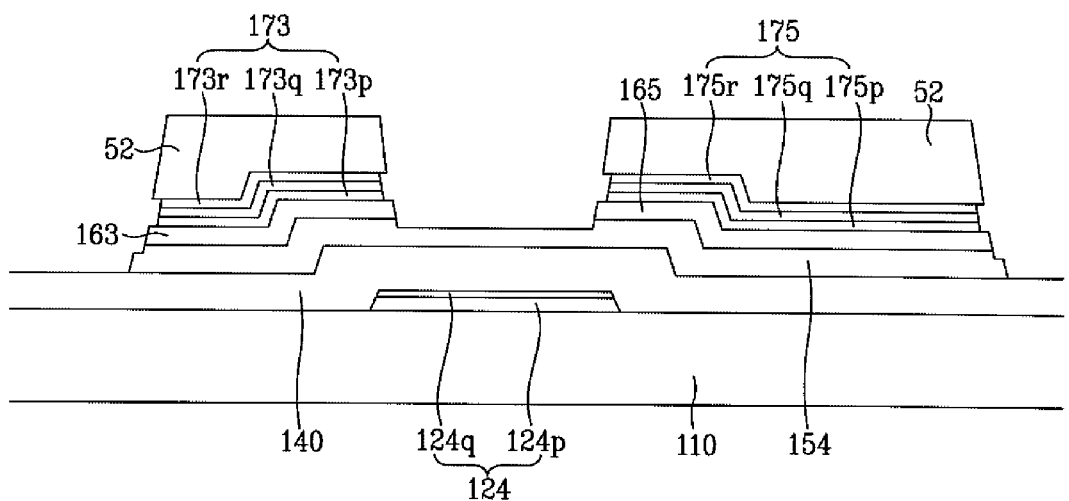

As shown in FIGS. 10 to 11B, a plurality of data lines 171 having source electrodes 173 and a plurality of drain electrodes 175, a plurality of ohmic contact stripes 161 having projections 163 and a plurality of ohmic contact islands 165, and a plurality of semiconductor stripes 151 having projections 154 are consecutively formed by a series of etching processes. In an embodiment, the etching process is as follows:

(1) removing a third portion of the conductive film 170, the doped amorphous silicon 160, and amorphous silicon 150 corresponding to the area B;

(2) removing a second portion of the photoresist corresponding to the channel area C;

(3) removing a second portion of the conductive film 170 and the doped amorphous silicon 160 corresponding to the channel area C; and (4) removing a first portion of the photoresist corresponding to the data line area A.

In another embodiment, the etching process is as follows:

(1) removing a third portion of the conductive film 170 corresponding to the area B;

(2) removing a second portion of the photoresist corresponding to the channel area C;

(3) removing a third portion of the doped amorphous silicon 160 and amorphous silicon 150 corresponding to the area B;

(4) removing a second portion of the conductive film 170 corresponding to the channel area C;

(5) removing a first portion of the photoresist corresponding to the data line area A; and (6) removing a second portion of the doped silicon 160 corresponding to the channel area C. This second embodiment is described further as follows.

Figure 7A:
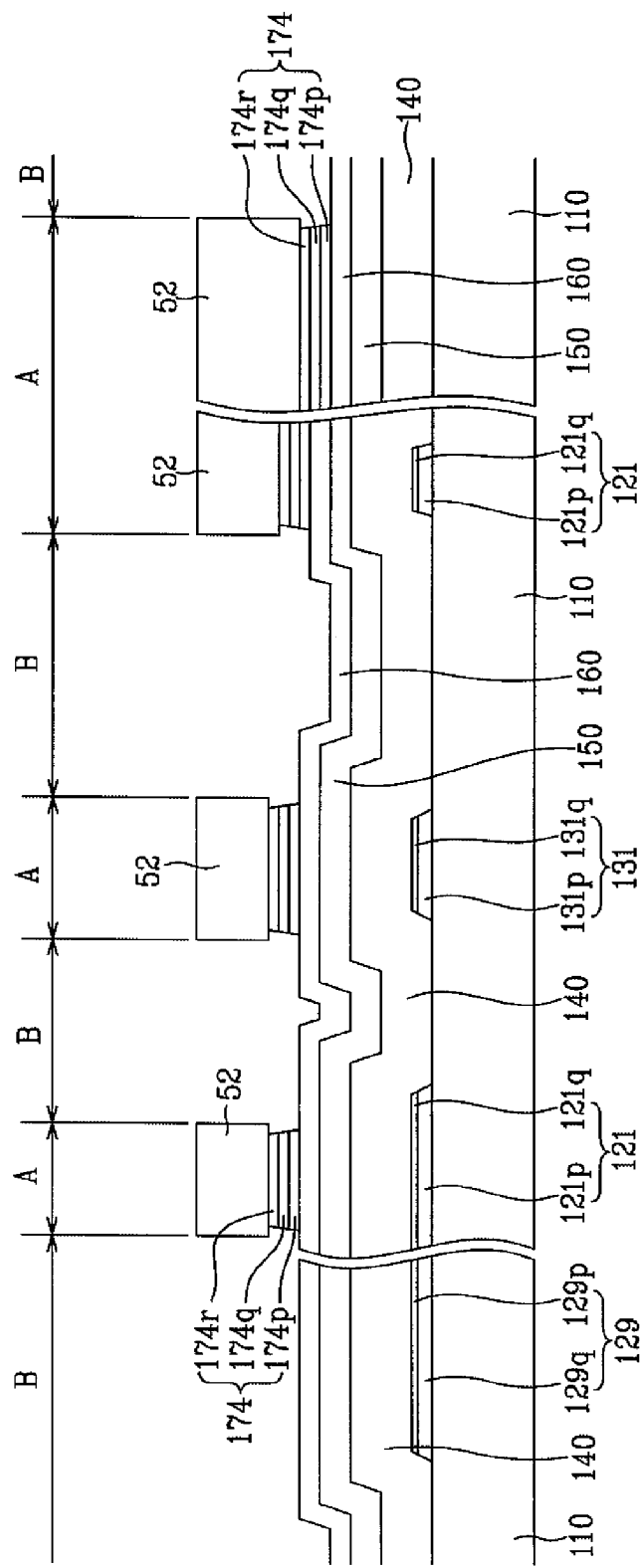
FIGS. 7A and 7B are cross sectional views showing the steps following those discussed in reference to FIGS. 6A and 6B respectively.
Figure 7B:
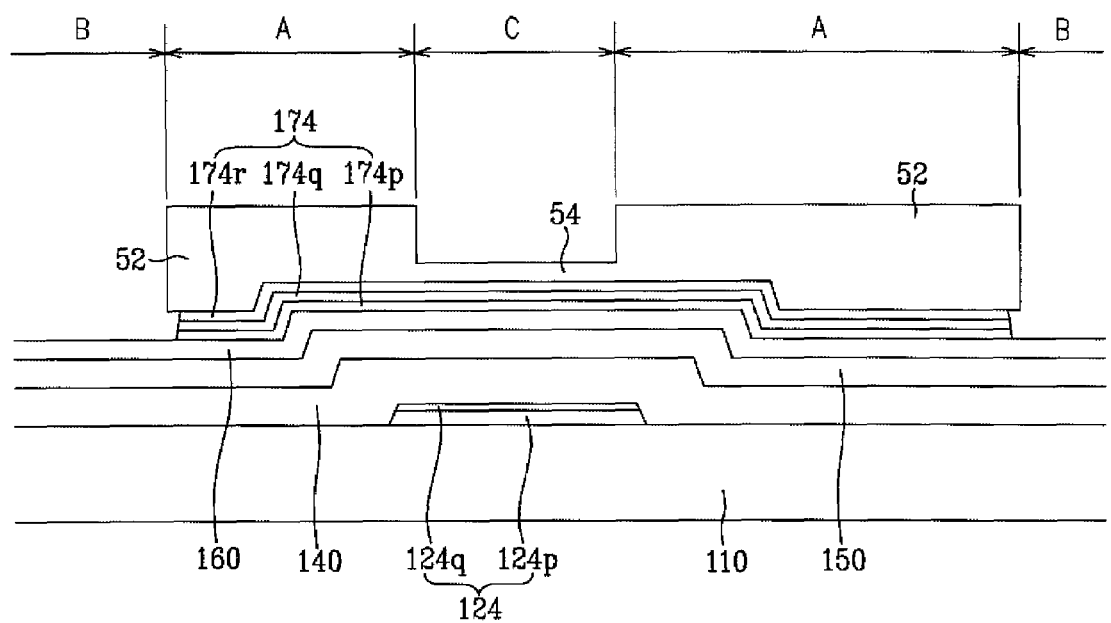

Referring to FIGS. 7A and 7B, the conductive film 170 of FIGS. 6A and 6B, which is formed in the area B, is removed by a wet or a dry etching process to form a conductive film pattern 174 including an upper layer 174r, an intermediate layer 174q, and a lower layer 174p and expose the third portion of the underlying doped amorphous silicon 160. Conductive film pattern 174 includes portions of the conductive layer 170, including the data lines 171 and the drain electrode 175 connected to each other. Conductive film 170 made of Al can be etched by a wet etching process, the conductive film 170 made of Mo can be etched by a wet or a dry etching process, and the multi-layered structural conductive film by a wet or a dry etching process. In an exemplary embodiment of this present invention, multi-layered conductive film 170 is formed of a three-layered conductive film including Al and Mo, which can be patterned by a wet etching process using a solution including $CH_3COOH$, $HNO_3$, $H_3PO_4$, and $H_2O$.

In a dry etching process, an upper portion of the photoresist (e.g., of photoresists 52 and 54) may be removed during the removal of the conductive film 170 of the area B. In a wet etching process having a property of isotropic etching, lateral sides of the conductive film pattern 174 under the photoresist 52 and 54 are removed further to form an under-cut structure.

Figure 8A:
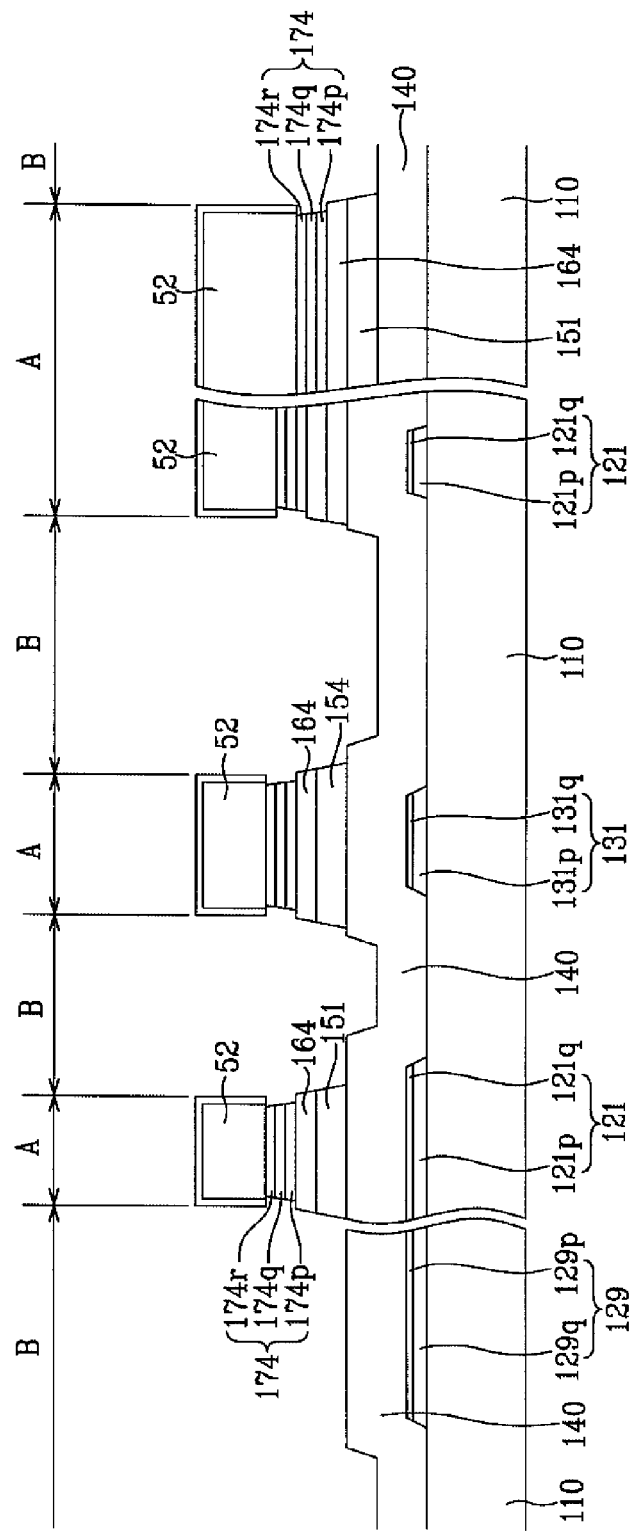
FIGS. 8A and 8B are cross-sectional views showing the steps following those discussed in reference to FIGS. 7A and 7B respectively.
Figure 8B:
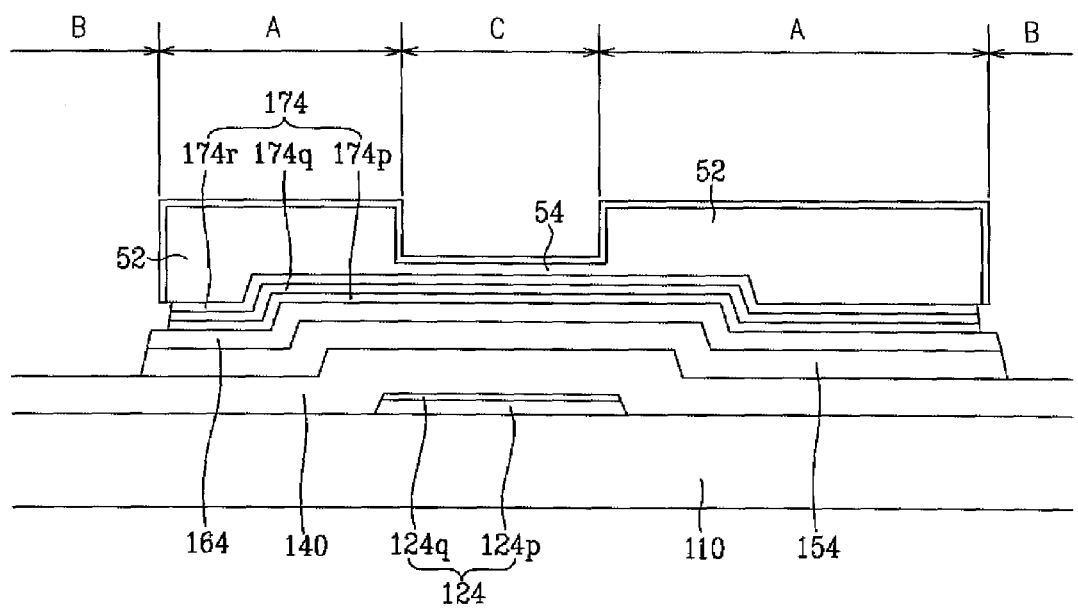

Referring to FIGS. 8A and 8B, the doped amorphous silicon 160 and the underlying intrinsic amorphous silicon 150 shown in FIGS. 7A and 7B, are removed by a dry etching process to form an intrinsic semiconductor stripe 151 having projection 154 and the doped amorphous silicon pattern 164 (i.e., pattern 164 refers to portions of extrinsic a-Si layer 160, including ohmic contact stripes and islands 161 and 165 connected to each other, referred to as extrinsic semiconductor stripes). Due to a property of the dry etch, portions of photoresist 52 and 54 (e.g., top and side portions) may be removed or partially etched to a certain thickness to reduce the projecting portions of the amorphous silicon 151, 154, and 164. A dotted line of the photoresist 52 and 54 shows their appearance before removing portions or all of photoresists 52 and 54.

Figure 9A:
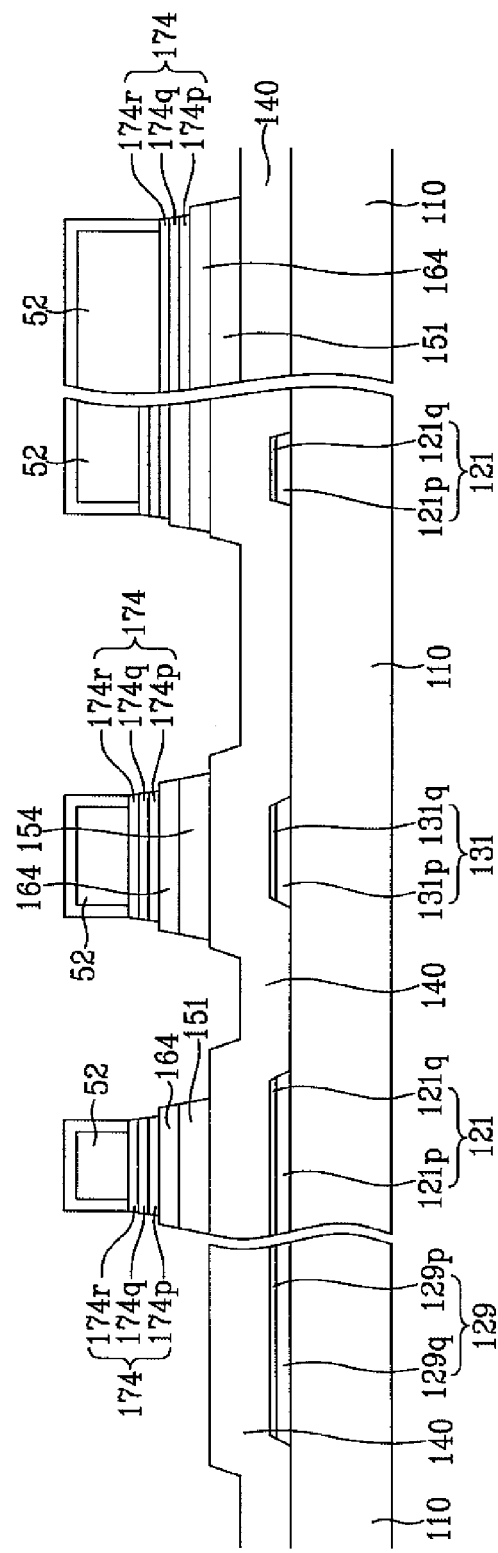
FIGS. 9A and 9B are cross sectional views showing the steps following those discussed in reference to FIGS. 8A and 8B respectively.
Figure 9B:
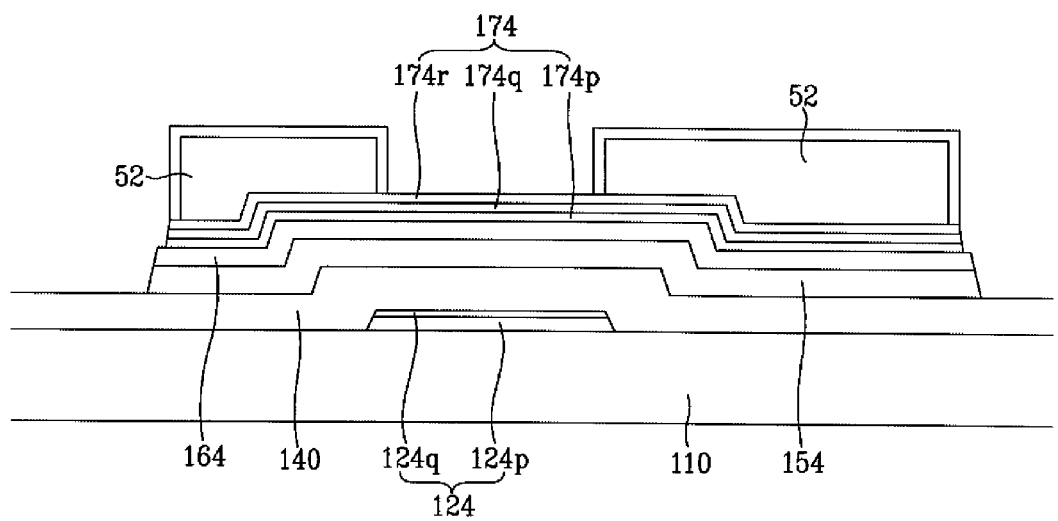

Referring to FIGS. 9A and 9B, the remaining residue of photoresist 54 corresponding to the channel area C shown in FIG. 8B, is removed by an ashing process to expose the conductive film 174. At the same time, portions of photoresist 52 are removed to reduce its thickness and the conductive film 174 is protruded from the edge of the photoresist 52. A steep or reversal tapered slope of a negative photoresist makes the protruded width of the conductive film 174 and the intrinsic semiconductor 151 smaller relative to a positive photoresist.

Referring to FIGS. 10 to 11B, the conductive film 174 and the doped amorphous silicon pattern 164 of FIGS. 8A to 8B corresponding to the channel C are removed (e.g., by using the first portion 52 of the photoresist as an etch mask) to form a data line 171 having a source electrode 173 including an upper layer 173r, an intermediate layer 173q, and a lower layer 173p, a drain electrode 175 including an upper layer 175r, an intermediate layer 175q, and a lower layer 175p, an ohmic contact stripe 161 having a protrusion 163, and an ohmic contact island 165. At the same time, a portion of the lateral side of the conductive film 174, the doped amorphous silicon pattern 164, and the intrinsic semiconductor stripe 154 protruding from the edge of the photoresist 52 is removed.

Accordingly, the smaller protruded width of the conductive film 174 and the intrinsic semiconductor stripe 151 after the ashing process increases a size of the display area after completing drain electrode 175 and ohmic contact island 165.

As shown in FIG. 11B, the thickness of the intrinsic semiconductor stripe 154 can be reduced and photoresist 52 can be removed or etched to a predetermined thickness.

Figure 15A:
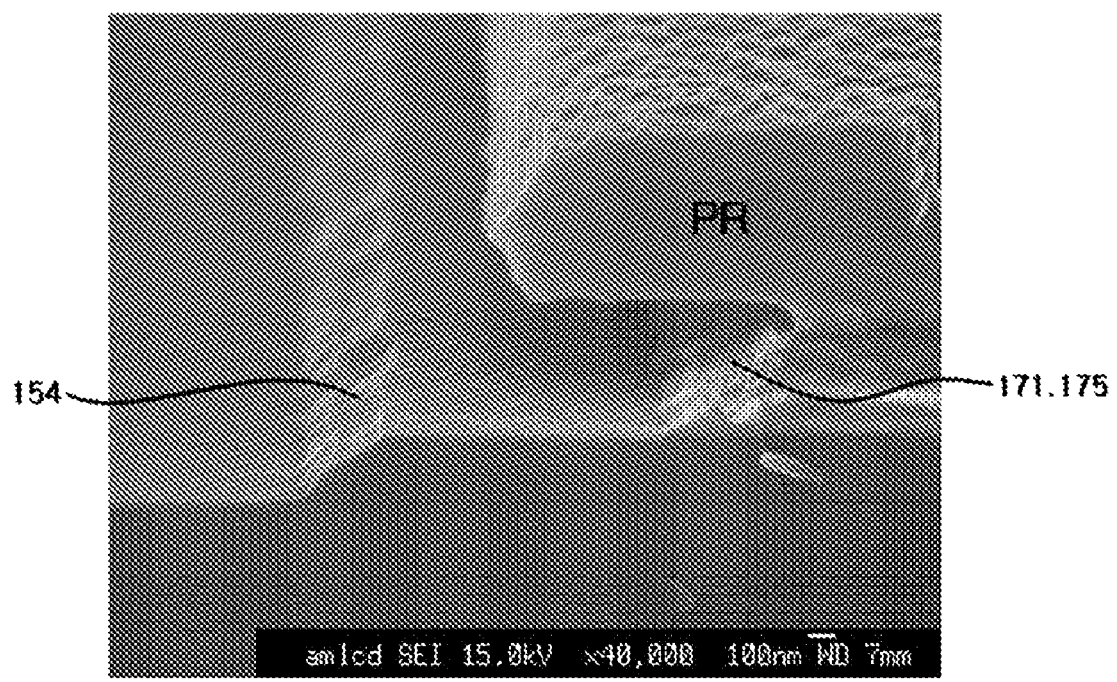
FIG. 15A is a scanning electron microscope picture taken of a data line, a drain electrode, and an intrinsic semiconductor layer patterned by a positive photoresist.
Figure 15B:
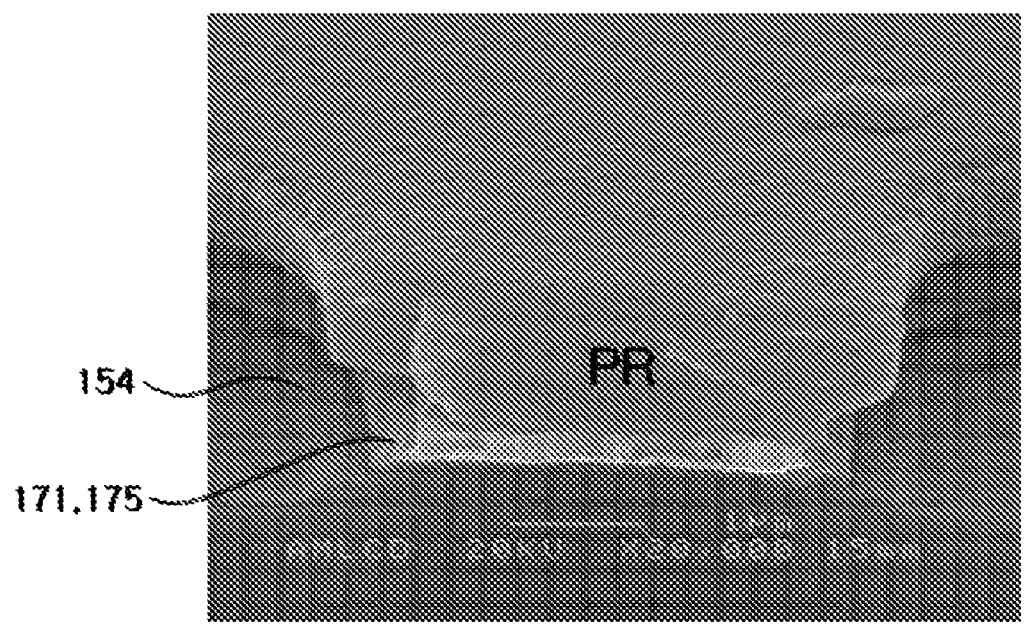
FIG. 15B is a scanning electron microscope picture taken of a data line, a drain electrode, and an intrinsic semiconductor layer patterned by a negative photoresist.

Referring to FIGS. 15A and 15B, an intrinsic semiconductor 154 is more revealed from the edge of the data line 171 or the drain electrode 175 in a positive photoresist pattern PR1 than in a negative photoresist pattern PR2. In the case of using the negative photoresist, the protruded width of the intrinsic semiconductor 151 from the edge of the data line 171 or the drain electrode 175 is less than 1 μm.

Figure 12:
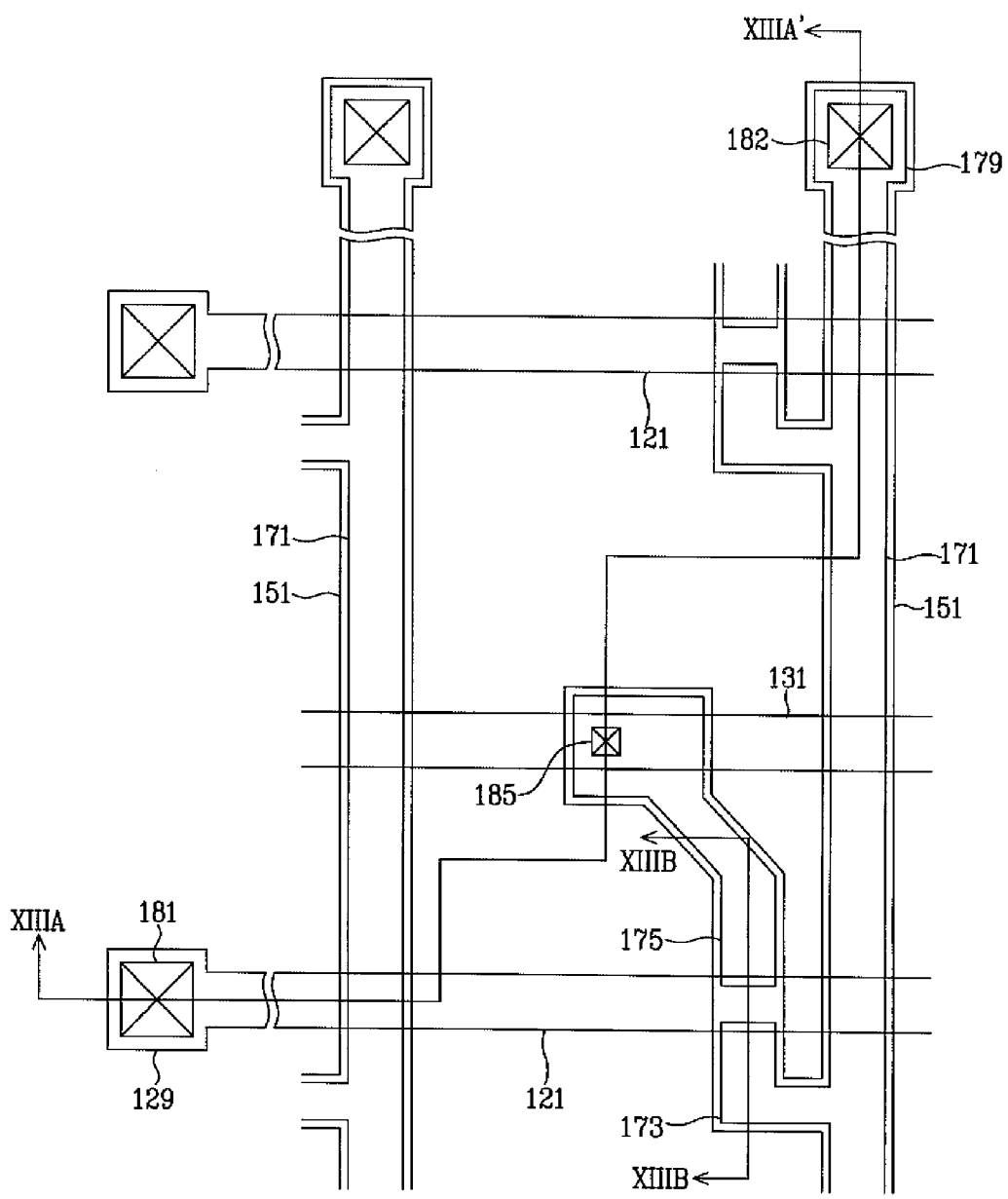
FIG. 12 is a plan view showing the steps following those discussed in reference to FIGS. 11A and 11B of fabricating a TFT array panel according to an embodiment of this present invention.
Figure 13A:
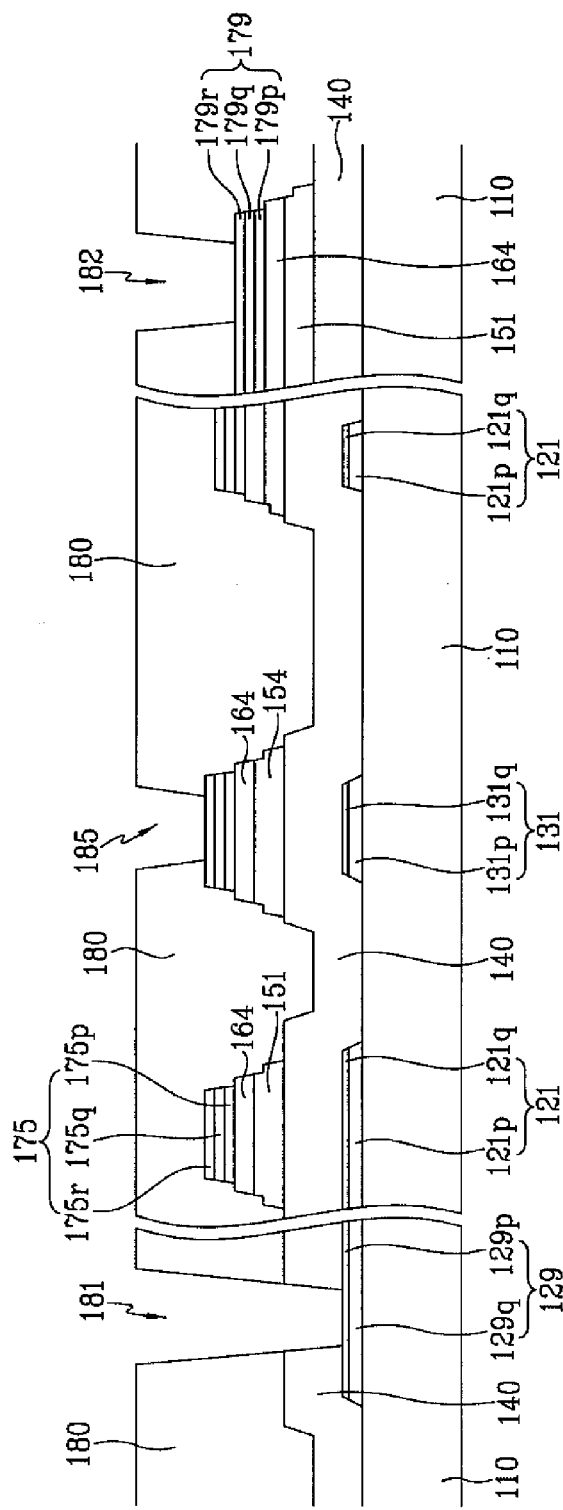
FIGS. 13A and 13B are cross sectional views taken along the lines XIIIA-XIIIA' and XIIIB-XIIIB' respectively of FIG. 12.
Figure 13B:
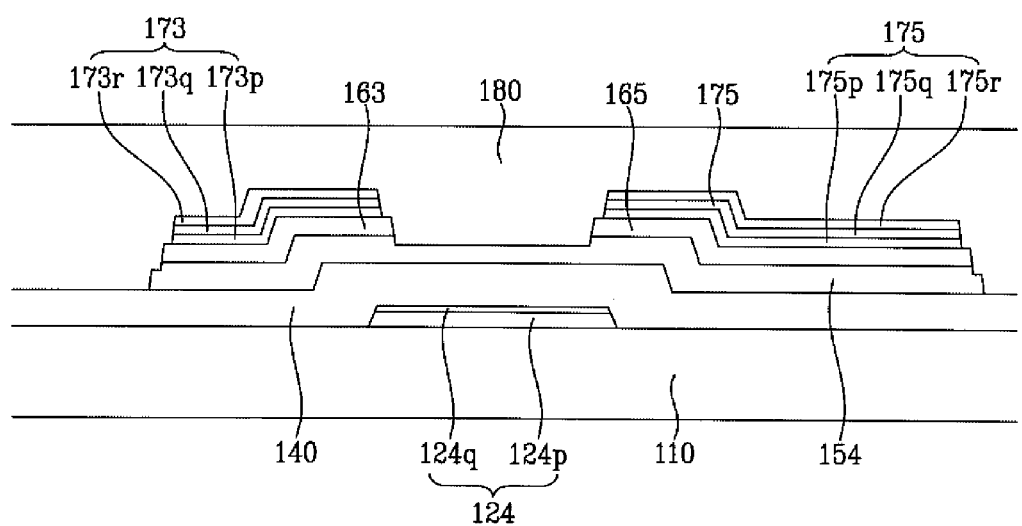

Referring to FIGS. 12 to 13B, an organic insulating material or inorganic insulating material is formed and patterned to form a passivation layer 180 having a plurality of contact holes 185 and 182 (e.g., by etching) on the data line 171, the drain electrode 175, and the gate insulating layer 140. A contact hole 181 exposing the end portion 129 of the gate line 121 is formed by removing a portion of the passivation layer 180 and the gate insulating layer 140 simultaneously.

Referring to FIGS. 1 to 3, about 500 to 1,500 Å IZO or ITO layer is formed by a sputtering and patterned (e.g., photo-etched) to form a plurality of pixel electrodes 190 and contact assistants 81 and 82. IZO can be etched by using a solution (e.g., Cr etchant) including $HNO_3$, $(NH_4)_2Ce(NO_3)_6$, and $H_2O$ to prevent the data line 171, the drain electrode 175 and the gate line 121 having Al to erode. In this embodiment, manufacturing processes are reduced by forming the data line 171, the drain electrode 175, the underlying ohmic contacts 161 and 165, and the intrinsic semiconductor 151 using one mask.

In another embodiment according to this present invention, a gate electrode 124, a semiconductor 151, a source electrode 173, and a drain electrode 175 form a TFT, which can have various shapes, on a TFT array panel, and a pixel electrode 190 can have a cutout for separating display domains.

Figure 16:
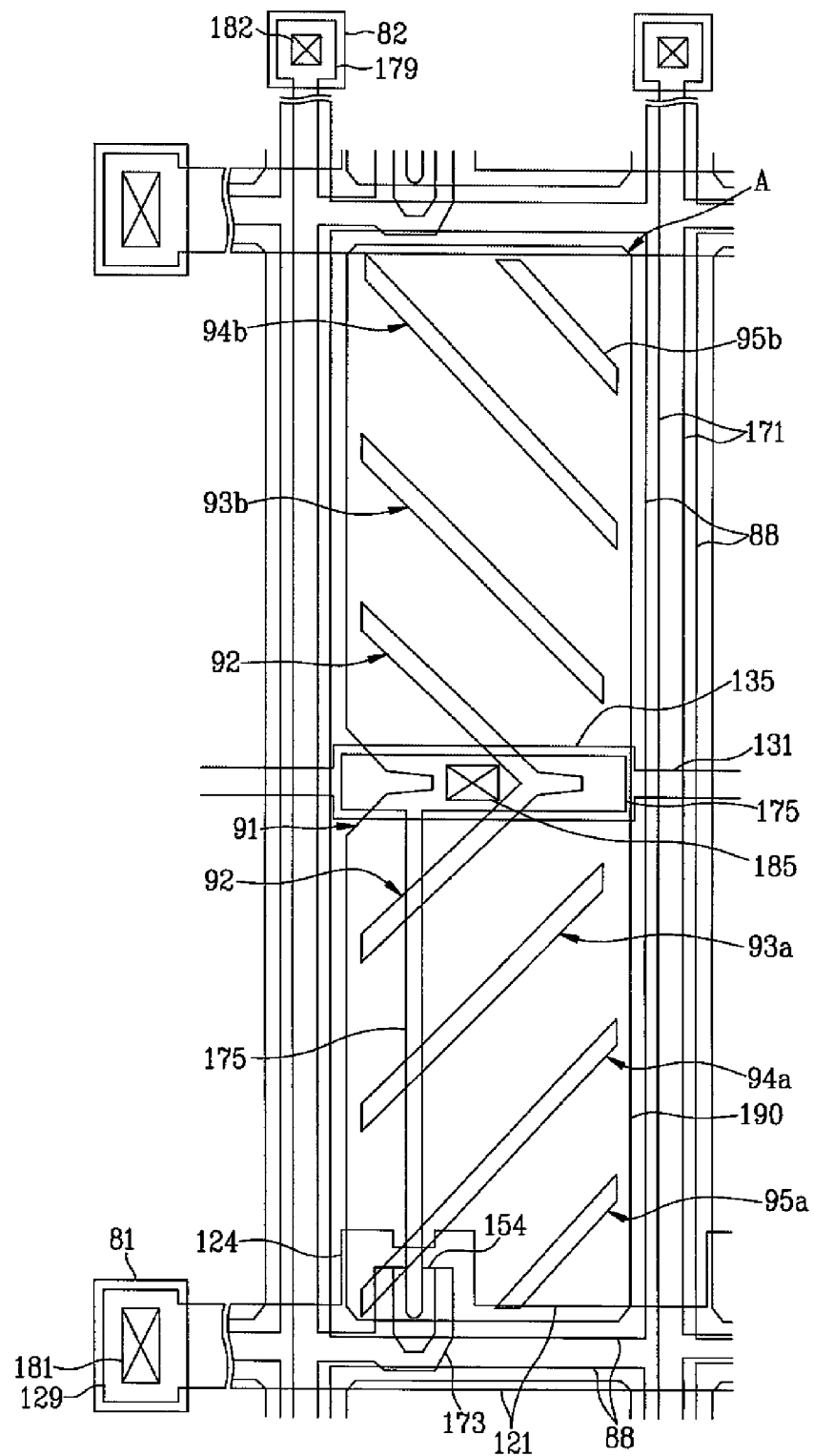
FIG. 16 is a plan view showing a TFT array panel for an LCD according to another embodiment of the present invention.
Figure 17:
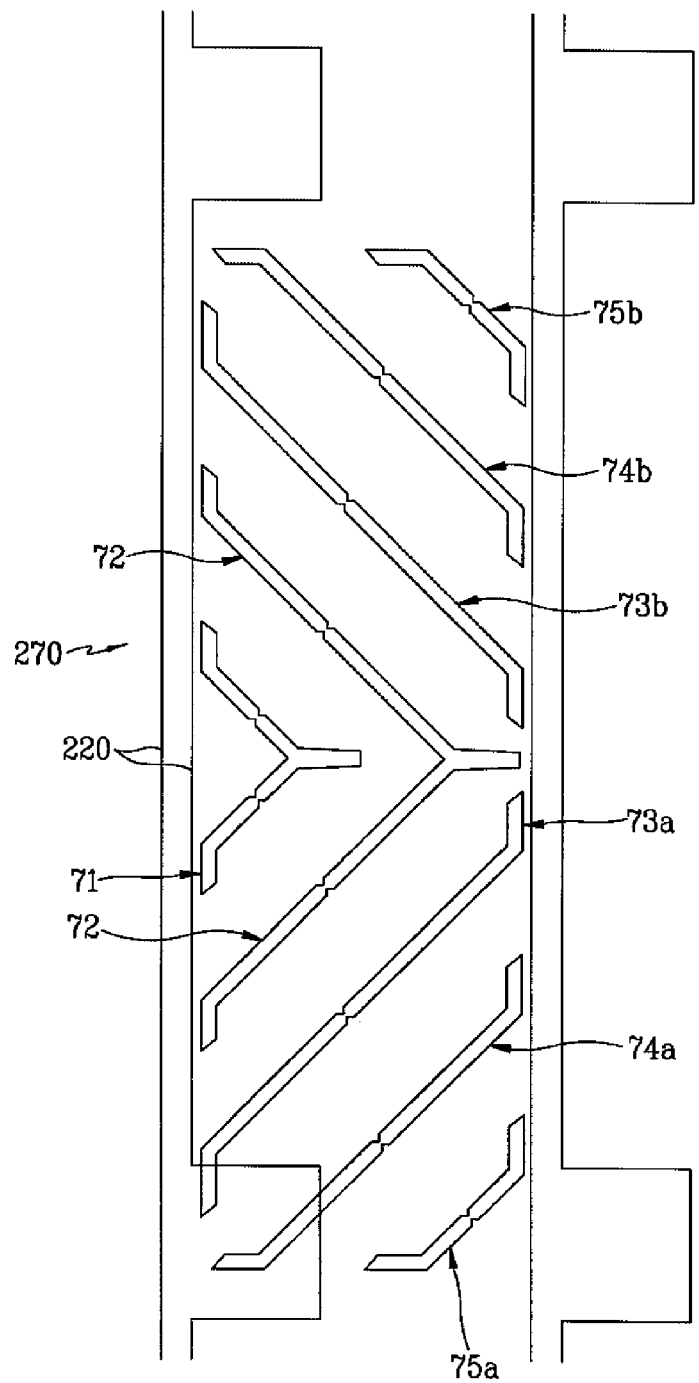
FIG. 17 is a plan view showing a common electrode panel for an LCD according to another embodiment of the present invention.
Figure 18:
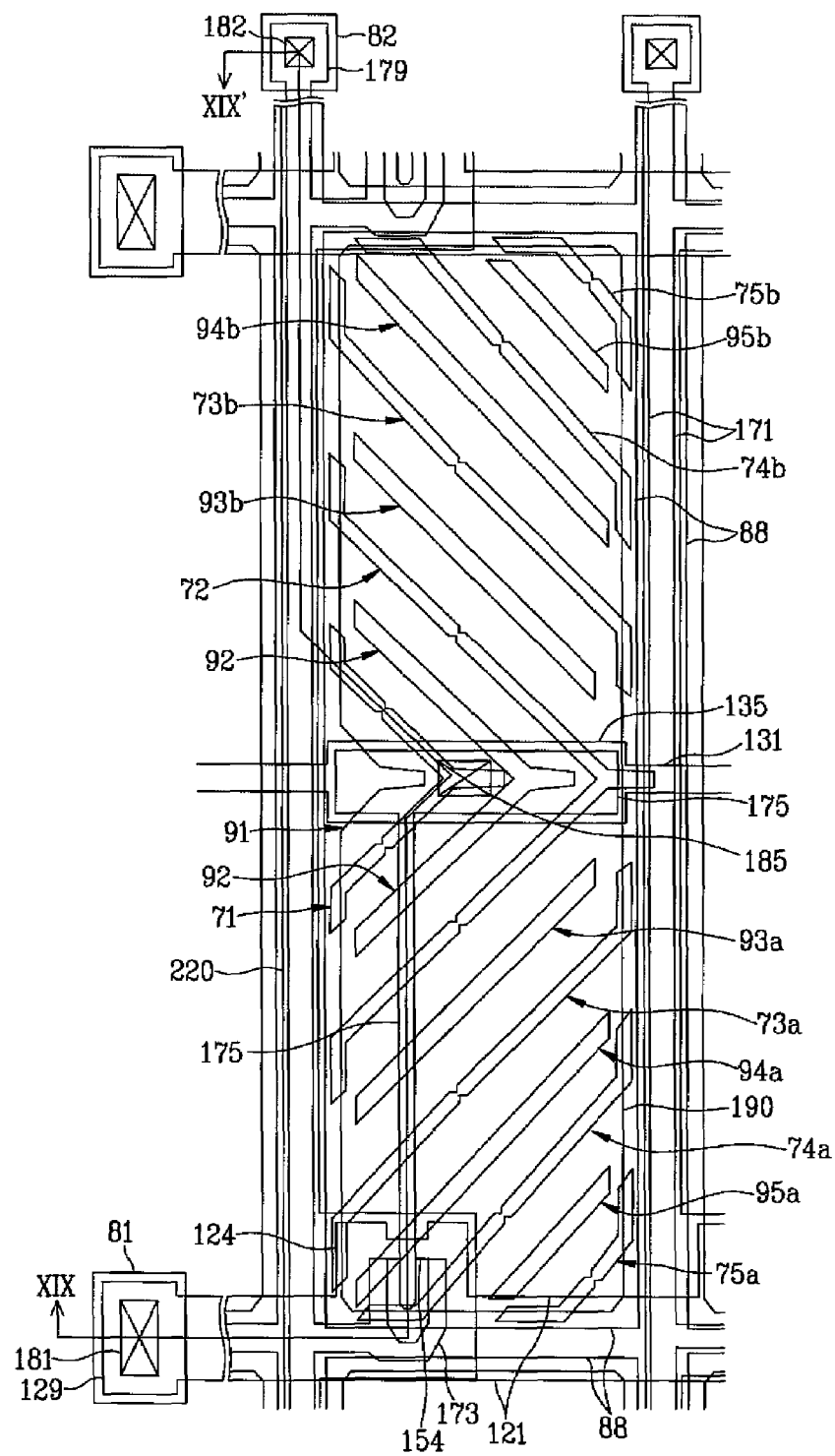
FIG. 18 is a plan view showing an LCD according to another embodiment, including the panels shown in FIGS. 16 and 17.
Figure 19:
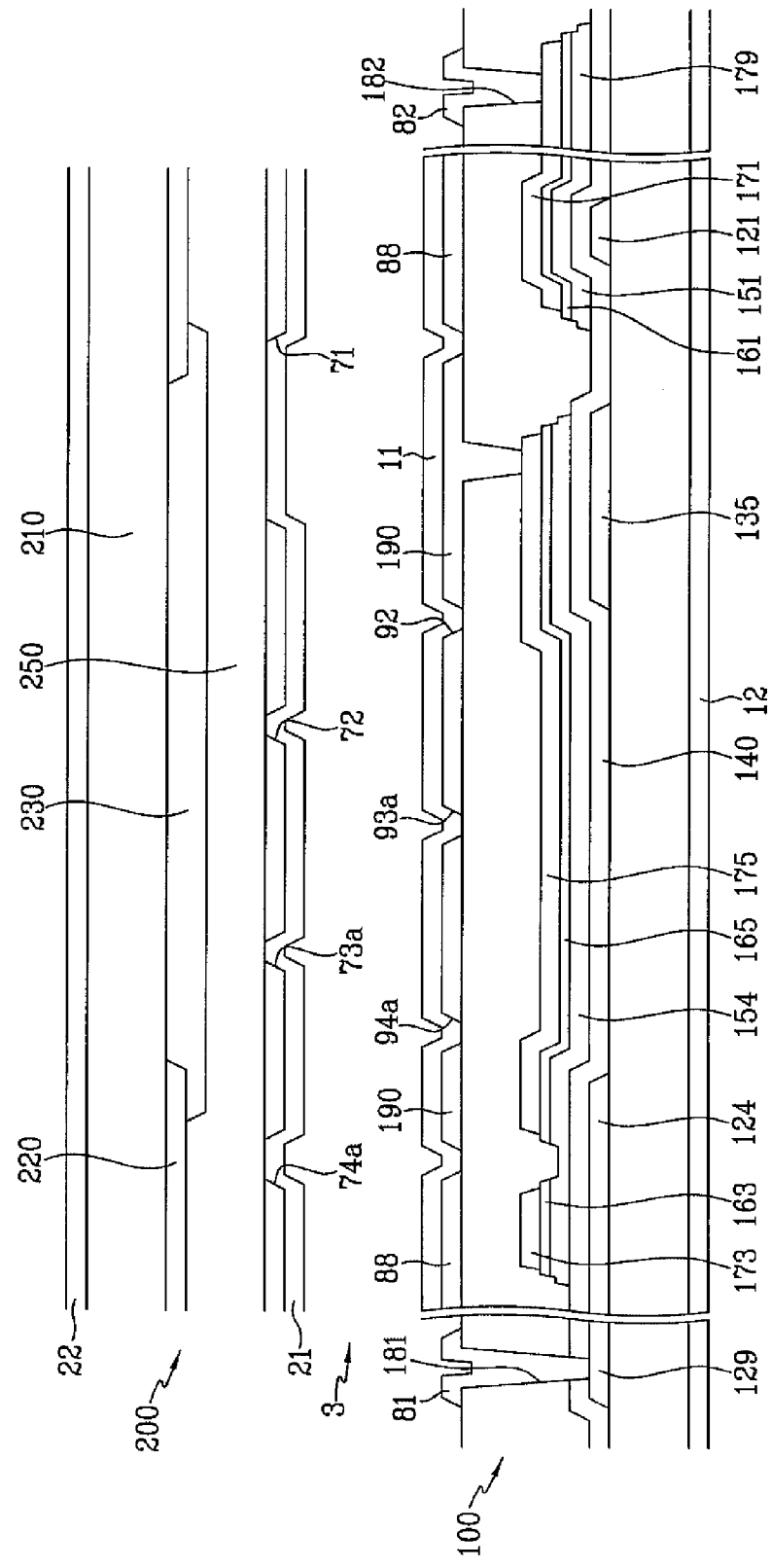
FIG. 19 is a cross-sectional view taken along the line XIX-XIX' of FIG. 18.

FIG. 16 is a plan view of a TFT array panel for an LCD according to another embodiment of this present invention, and FIG. 17 is a plan view of a common electrode panel for an LCD according to another embodiment of this present invention. FIG. 18 is a plan view of an LCD having the TFT array panel of FIG. 16 and the common electrode panel of FIG. 17. FIG. 19 is a cross sectional view taken along the line XIX-XIX' of the LCD shown in FIG. 18.

Referring to FIGS. 16 to 19, an LCD includes a TFT array panel 100, a common electrode panel 200, an LC layer 3 interposed between panels 100 and 200, and a pair of polarizers 12 and 22 attached outside of corresponding panels 100 and 200. The cross sectional structure of the TFT array panel 100 according to this embodiment is similar to the TFT array panel shown in FIGS. 1 and 2.

A plurality of gate lines 121 have gate electrodes 124 and end portions 129 having relatively larger width, and a plurality of storage electrode lines 131 having storage electrodes 135 are formed on a substrate 110. The gate electrode 124 is projected upward and downward from the gate line 121. A gate insulating layer 140 is formed on the gate lines 121, the storage electrode lines 131, and the substrate 110. A plurality of semiconductor stripes 151 having projections 154, a plurality of ohmic contract stripes 161 having projections 163 and ohmic contact islands 165 spaced apart from the ohmic contact stripes 161 are formed consecutively on the gate insulating layer 140.

A plurality of data lines 171 having source electrodes 173 and a plurality of drain electrodes 175 are formed on the ohmic contacts 161 and 165. The source electrode 173 is protruded toward the drain electrode 175 and has a "U" shape to encompass a portion of the drain electrode 175 on the semiconductor projection 154. Accordingly, a channel on the semiconductor projection 154 between the source electrode 173 and the drain electrode 175 has a "U" shape to maximize the width of the channel even in a narrow or limited area.

A passivation layer 180 is formed on the data lines 171, the drain electrodes 175, and the gate insulating layer 140. The passivation layer 180 has a plurality of contact holes 181, 182, and 185. The contact holes 185 are through-holes penetrating the gate insulating layer 140.

A plurality of pixel electrodes 190 and a plurality of contact assistants 81 and 82 are formed on the passivation layer 180. An aligning film, which arranges a LC molecule, is formed on the pixel electrodes 190 and the passivation layer 180.

Each pixel electrode 190 has chamfered corners and the chamfered edge makes an angle of approximately 45 degrees relative to the gate line 121. The pixel electrode 190 includes middle cutouts 91 and 92, lower cutouts 93a, 94a, and 95a, and upper cutouts 93b, 94b, and 95b. The cutouts divide the pixel electrode 190 into a plurality of domains or partitions.

The lower cutouts 93a, 94a, and 95a are located in the lower portion of the pixel electrode 190 with respect to a virtual transverse line to bisect the pixel electrode 190. The upper cutouts 93b, 94b, and 95b are located in the upper portion of the pixel electrode 190 with respect to the virtual transverse line to bisect the pixel electrode 190.

The lower cutouts 93a, 94a and 95a extend obliquely from a left edge of the pixel electrode 190 to an upper right edge of the pixel electrode 190. The upper cutouts 93b, 94b and 95b extend obliquely from a left edge of the pixel electrode 190 to a lower right edge of the pixel electrode 190.

The lower cutouts 93a, 94b and 95b and the upper cutouts 93b, 94b, and 95b are symmetrical about the virtual transverse line, and make an angle of approximately 45 degrees relative to the gate line 121 to form a right angle between the lower cutouts 93a, 94b and 95b and the upper cutouts 93b, 94b, and 95b. The middle cutouts 91 and 92 have a pair of inclined edges substantially parallel to the lower cutouts 93a, 94b and 95b and the upper cutouts 93b, 94b, and 95b, respectively. The middle cutouts 91 and 92 have a transverse portion extending from the center in a transverse direction.

The upper portion and the lower portion of the pixel electrode 190 is divided into five domains (e.g., five upper and five lower partitions) by the cutouts 91, 92, 93a, 93b, 94a, 94b, 95a, and 95b. These five domains in the upper portion and the lower portion are symmetrical about the virtual transverse line that bisects the pixel electrode 190 into upper and lower regions. The number of domains or the number of the cutouts may vary depending on design factors such as the size of pixels, the ratio of the transverse edges and the longitudinal edges of the pixel electrode 190, and the type and characteristics of the LC layer 3.

A blocking electrode 88, which is provided with a common voltage, is formed on the same layer as the pixel electrode 190 and extends along the data lines 171 and the gate lines 121.

The blocking electrode 88 is formed on the data line 171 to prevent interference of an electric field between the data line 171 and the pixel electrode 190 and between the data line 171 and the common electrode 270 in order to reduce a data signal delay and a voltage distortion applied to the pixel electrode 190.

The blocking electrode 88 can be formed on the gate line 121 as shown in FIG. 19. The blocking electrode 88 covers the data line 171, but is located inside the edges of the gate line 121 (e.g., narrower width than gate line 121). Alternatively, the width of the blocking electrode 88 may be narrower than then the data lines 171 and/or wider than the gate line 121. To apply a common voltage to blocking electrode 88, blocking electrode 88 may be connected to storage electrode line 131 through a contact hole (not shown) of passivation layer 180 and gate insulating layer 140, or be connected to a short point transmitting the common voltage from TFT array panel 100 to common electrode panel 200.

In general, it may be desirable to minimize a distance between blocking electrode 88 and pixel electrode 190 to maximize the aperture. The blocking electrode 88 is spaced apart from the pixel electrode 190 at a determined distance to prevent a short circuit between them, which also reduces a parasitic capacitance between them and also between pixel electrodes 190 and data line 171. A constant distance between pixel electrode 190 and blocking layer 88 made of the same layer results in a constant parasitic capacitance between them. Moreover, because the permittivity of LC layer 3 is higher than that of passivation layer 180, the parasitic capacitance between the data line 171 and the blocking electrode 88 is less than a parasitic capacitance between the data line 171 and the common electrode 170 without blocking electrode 88.

The common electrode 270 and the blocking electrode 88 are provided with the same common voltage so that an electric field between the common electrode 270 and the blocking electrode 88 is substantially zero. Accordingly, LC molecules (not shown) between the common electrode 270 and the blocking electrode 88 keep an initial orientation (e.g., maintain the initial vertical alignment status) to prevent light incident to this portion from penetrating LC molecules (i.e., the light is blocked).

Referring now to FIGS. 17 to 19, common electrode panel 200 will be described. A light blocking member 220, such as a black matrix, is formed on an insulating substrate 210 (e.g., transparent glass). The light blocking member 220 can be disposed in the area corresponding to the data line 171 and other portions of the TFT. In another exemplary embodiment, the light blocking member 220 can have a plurality of apertures or openings in the area corresponding to a plurality of the pixel electrode 190 (e.g., openings face pixel electrodes 190 and may have substantially the same shape as pixel electrodes 190).

A plurality of color filters 230 are formed on substrate 210 and are disposes substantially in the areas enclosed by light blocking members 220. The color filters 230 can extend substantially in a longitudinal direction along the pixel electrodes 190. The color filters 230 can represent at least one the primary colors, such as red, green, or blue.

An overcoat 250 is formed on the color filters 230. A common electrode 270 made of a transparent conductive layer, such as ITO or IZO, is formed on the overcoat 250. The common electrode 270 has a plurality of sets of cutouts 71, 72, 73a, 73b, 74a, 74b, 75a, and 75b.

Each set of cutouts 71, 72, 73a, 73b, 74a, 74b, 75a, and 75b faces a pixel electrode 190, and includes middle cutouts 71 and 72, lower cutouts 73a, 74a, and 75a, and upper cutouts 73b, 74b, and 75b. Each of the cutouts 71, 72, 73a, 73b, 74a, and 74b is located between adjacent regular cutouts 91, 92, 93a, 93b, 94a, 94b, 95a, and 95b of the pixel electrode 190. Each of cutouts 75a and 75b is located between the edge cutouts 95b and 95b and the chamfered edges of the pixel electrode 190. Each of the cutouts 71, 72, 73a, 73b, 74a, 74b, 75a, and 75b includes an oblique portion extending parallel to the cutouts 91, 92, 93a, 93b, 94a, 94b, 95a, and 95b of pixel electrode 190.

Each of the lower and upper cutouts 73a, 73b, 74a, 74b, 75a, and 75b includes an oblique portion which extends approximately from a right edge of the pixel electrode 190 toward a lower edge or an upper edge of pixel electrode 190. Also, each of the lower and upper cutouts 73a, 73b, 74a, 74b, 75a, and 75b includes a transverse portion and/or a longitudinal portion, which extend from respective ends of the oblique portion along the edges of the pixel electrode 190, overlapping the edges of the pixel electrode 190, and making obtuse angles with the oblique portion.

Each middle cutout 71 and 72 includes a central transverse portion, a pair of oblique portions, and a terminal longitudinal portion. The central transverse portion extends approximately from a left edge of the pixel electrode 190 in a horizontal direction. The oblique portion extends from an end of the transverse portion toward a left edge of the pixel electrode 190 to make an oblique angle with the transverse portion. The terminal longitudinal portion extends from the respective ends of the oblique portions along the left edge of the pixel electrode 190, overlapping the left edge of the pixel electrode 190 to make an obtuse angle with the oblique portion.

The number of the cutouts 71, 72, 73a, 73b, 74a, 74b, 75a, and 75b may be varied, depending on the design rules or factors. The light blocking member 220 can overlap the cutouts 71, 72, 73a, 73b, 74a, 74b, 75a, and 75b to prevent light leakage around and/or through the cutouts 71, 72, 73a, 73b, 74a, 74b, 75a, and 75b.

The inner surfaces on the substrates 100 and 200 are coated with alignment films 11 and 21, respectively, which help LC molecules maintain an initial vertical orientation. The alignment films 11 and 21 may orient LC molecules in a horizontal direction. A pair of polarizers 12 and 22 is provided on the outer surfaces of the panels 100 and 200, respectively, such that their transmission axes are crossed, and one of the transmissive axes may be parallel to the gate lines 121. Polarizer 12 or 22 may be omitted when the LCD is a reflective LCD.

The LCD may further include at least one retardation film (not shown), which compensates for the retardation of the LC layer 3, between the panels 100 and 200 and the polarizers 12 and 22, respectively. The retardation film has a birefringence, which compensates the birefringence of LC layer 3, and can be formed of a uniaxial, biaxial, or negative uniaxial optical film. The LCD may further include a backlight unit to provide a light to the polarizers 12 and 22, the retardation film, the panels 100 and 200, and the LC layer 3.

The LC layer 3 has a negative dielectric anisotropy. The LC molecules (not shown) of the LCD layer 3 is oriented to have long axes of the LC molecules perpendicular (or vertical) with respect to the surfaces of the panels 100 and 200 without an electric field applied. Accordingly, a pair of polarizers with transmission axes crossed prevents light from penetrating.

A primary electric field, substantially perpendicular to the surfaces of the panels 100 and 200, is generated by application of a common voltage to the common electrode 270 and a data voltage to the pixel electrodes 190. The LC molecules tend to change their orientations in response to the electric field, such that their long axes are perpendicular to the field direction. The cutouts 71, 72, 73a, 73b, 74a, 74b, 75a, 75b, 91, 92, 93a, 93b, 94a, 94b, 95a, and 95b of common electrodes 270 and pixel electrodes 190, and the chamfered edges of the pixel electrodes 190 distort the primary electric field to have a horizontal component, which determines the tilt directions of the LC molecules. The horizontal component of the electric field is perpendicular to the edges of the cutouts 71, 72, 73a, 73b, 74a, 74b, 75a, 75b, 91, 92, 93a, 93b, 94a, 94b, 95a, and 95b and the chamfered edges of the pixel electrodes 190. The two horizontal components of the electrical field are generated in opposite directions with respect to the facing two edges of cutouts 71, 72, 73a, 73b, 74a, 74b, 75a, 75b, 91, 92, 93a, 93b, 94a, 94b, 95a, and 95b.

A tilt direction of the LC molecules in the LC layer 3 is controlled by the horizontal component of the electric field and the cutouts 71, 72, 73a, 73b, 74a, 74b, 75a, 75b, 91, 92, 93a, 93b, 94a, 94b, 95a, and 95b. A domain is defined by neighboring cutouts 71, 72, 73a, 73b, 74a, 74b, 75a, 75b, 91, 92, 93a, 93b, 94a, 94b, 95a, and 95b or cutouts 75a and 75b, and the right chamfered edges of the pixel electrode 190. The LC molecules in each domain are tilted perpendicular to a longitudinal direction of the cutouts 71, 72, 73a, 73b, 74a, 74b, 75a, 75b, 91, 92, 93a, 93b, 94a, 94b, 95a, and 95b. The longest two edges of each domain are almost or substantially parallel to each other, and make an angle of 45 degrees with the gate line 121. Accordingly, the LC molecules in the area defined by the gate line 121 and the data line 171 (i.e. corresponding to one pixel area), have four different tilted directions.

The cutouts 71, 72, 73a, 73b, 74a, 74b, 75a, 75b, 91, 92, 93a, 93b, 94a, 94b, 95a, and 95b have a width, for example, of about 9 μm to 12 μm. At least one of the cutouts 71, 72, 73a, 73b, 74a, 74b, 75a, 75b, 91, 92, 93a, 93b, 94a, 94b, 95a, and 95b can be replaced with a protrusion (not shown) or a depression (not shown). The protrusion can be formed of an organic or inorganic material, and disposed over or under the pixel electrode 190 or the common electrode 270 (i.e., field-generating electrodes). The protrusion, for example, has a width of about 5 μm to 10 μm.

Because a 45-degree intersection of the tilt directions of LC molecules and transmission axes of the polarizers 12 and 22 result in maximum transmittance, polarizers 12 and 22 may be attached such that the transmission axes of polarizers 12 and 22 are parallel or perpendicular to the edges of the panels 100 and 200, thereby obtaining a maximum brightness. This follows as the LC molecules in all domains form an angle of 45 degrees with the gate line 121, which is perpendicular or horizontal to the boundary line of panels 100 and 200.

In this embodiment of the present invention, the data line 171, the drain electrode 175, the ohmic contacts 161 and 165, and the semiconductor 151 are formed by a photolithography using a negative photoresist pattern (e.g., one photoresist pattern). In order to form the portions 54 with intermediate thickness of the photoresist pattern corresponding to the channel area C as shown in FIG. 7B, a photomask having a semi-transparent area can be used (e.g., which employ various types of slits and control the amount of transmitted light).

Figure 20A:
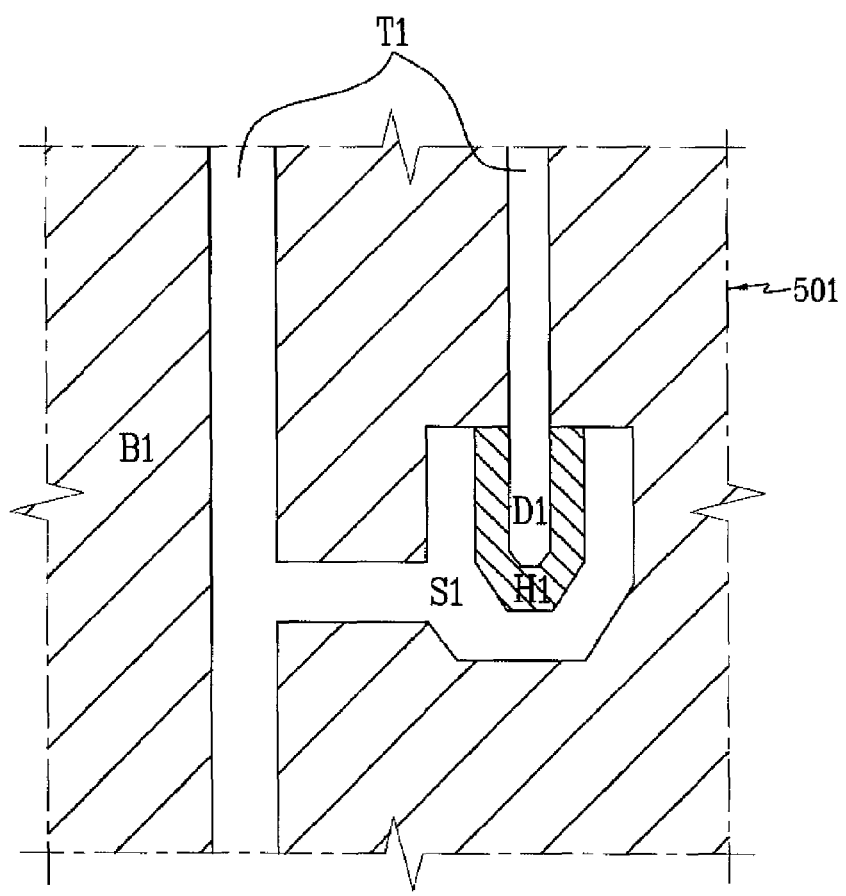
FIGS. 20A to 20D are plan views showing photomasks for fabricating a TFT array panel according to one or more embodiments of the present invention.
Figure 20B:
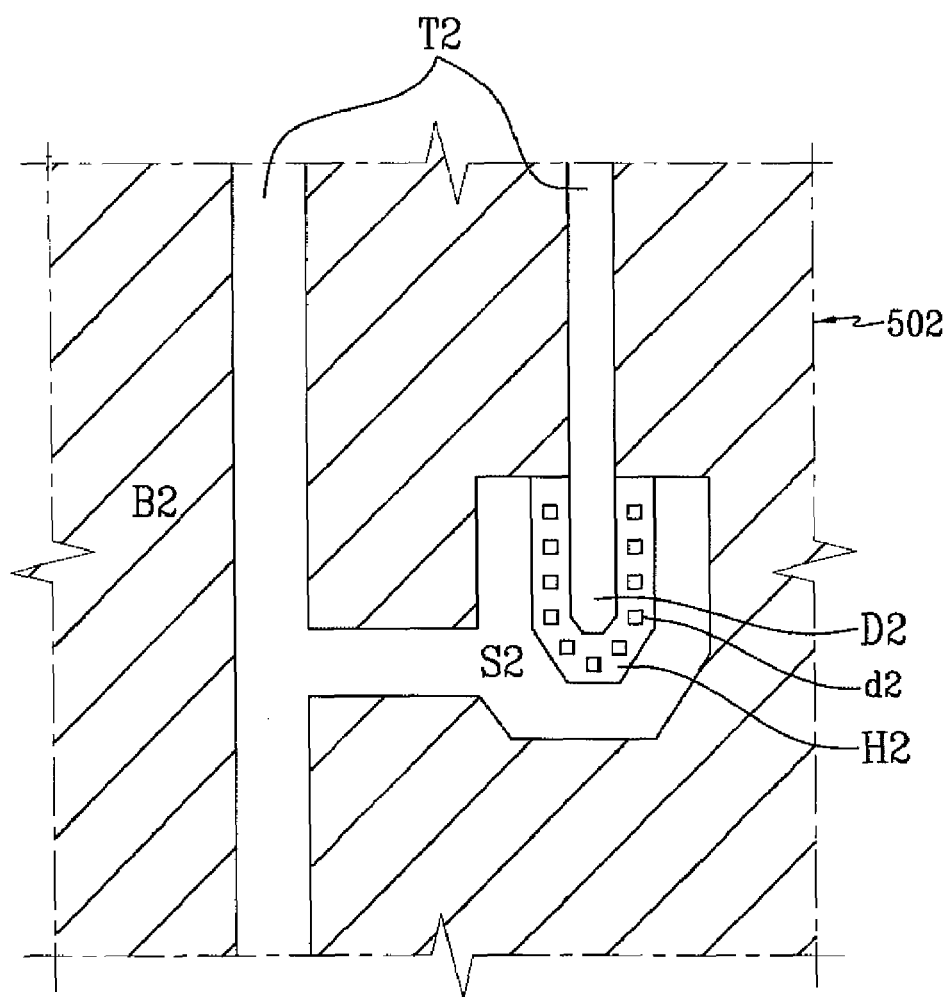
Figure 20C:
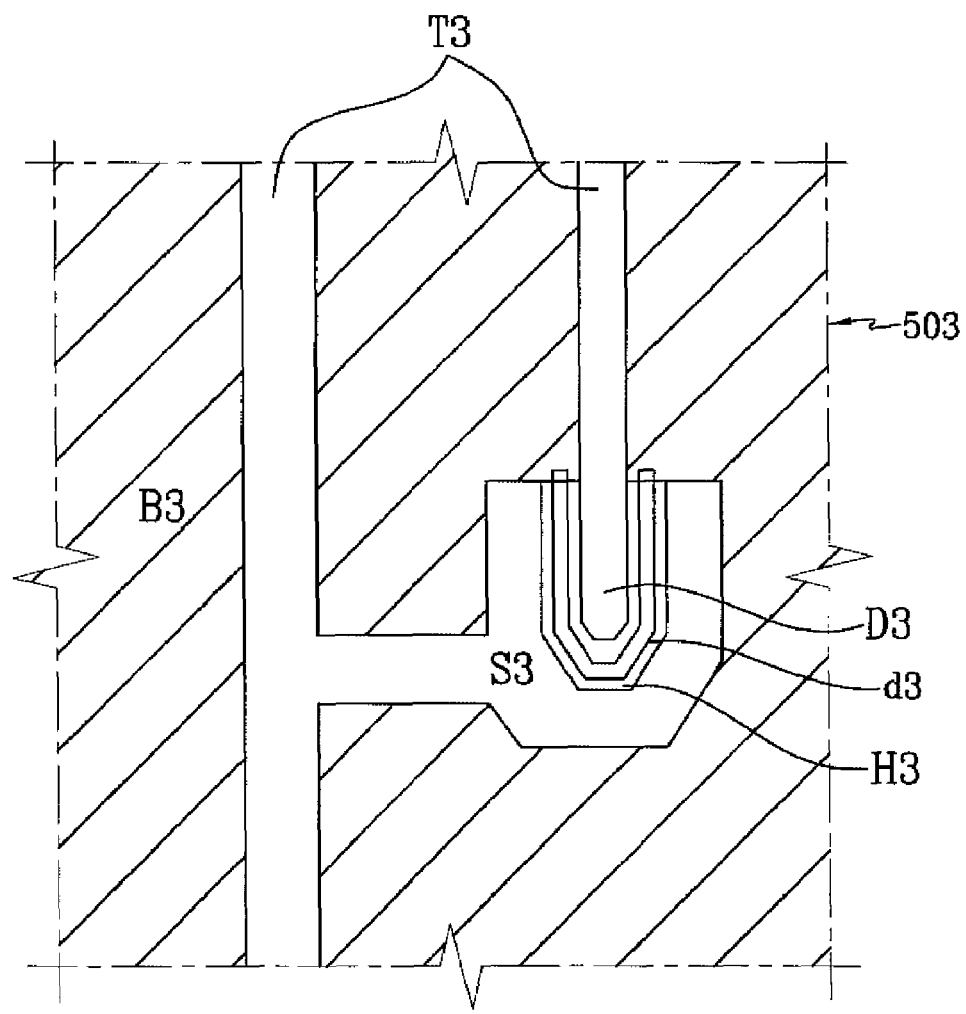
Figure 20D:
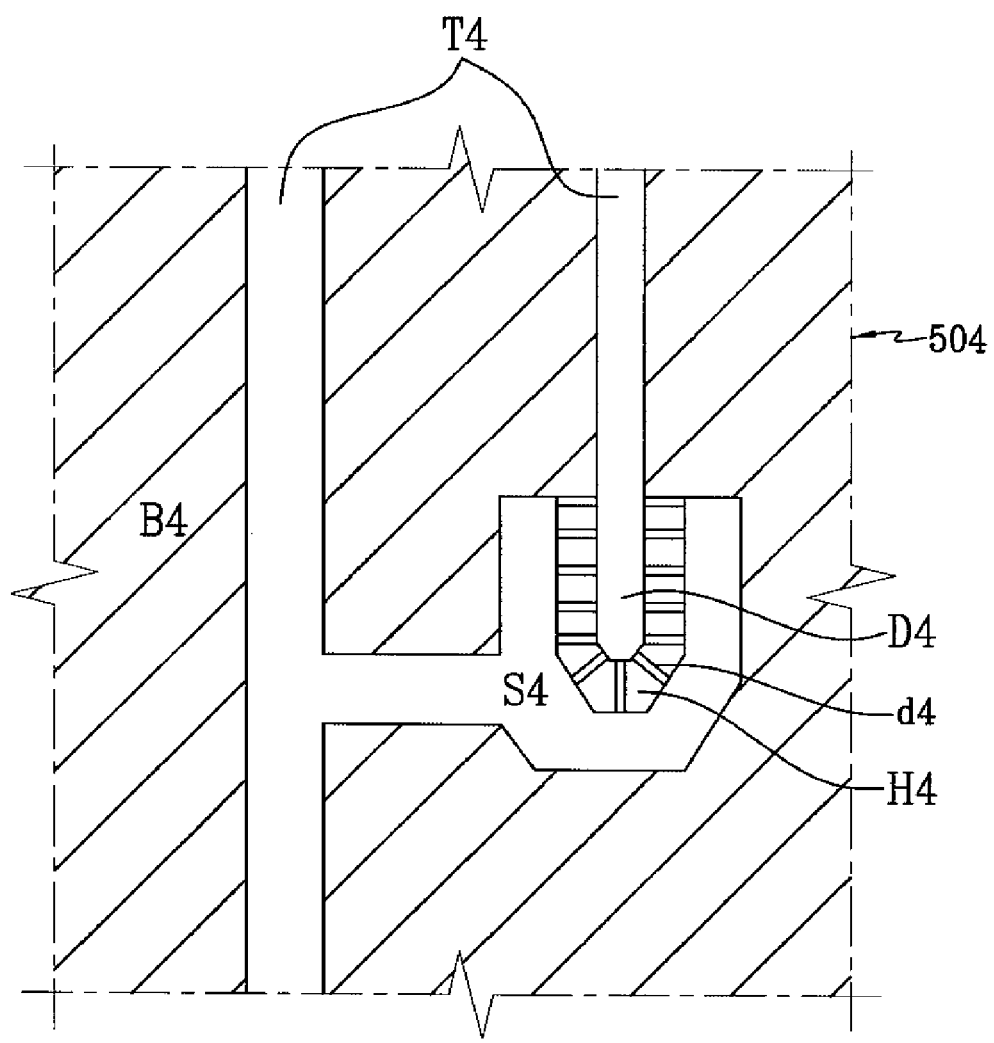

For example, FIGS. 20A to 20D show various structures to form a semi-transparent portion of the photomask according to embodiments of this present invention. As shown in FIGS. 20A and 20D, each photomask 501, 502, 503, and 504 includes transparent portions T1, T2, T3, and T4 corresponding to the data line area A shown in FIG. 7B, semi-transparent portions H1, H2, H3, and H4 corresponding to the channel area C, and opaque portions B1, B2, B3, and B4 corresponding to the remaining area B. The transparent portions T1, T2, T3, and T4 include a source part S1, S2, S3, and S4 corresponding to source electrode 173, and a drain part D1, D2, D3, and D4 corresponding to drain electrode 175.

Referring to FIG. 20A, a light penetrating semi-transparent part Hi is adopted by controlling a space between the source part Si and the drain part D1 without a slit structure to form a photoresist pattern 54 (shown in FIG. 7B) corresponding to the channel area C.

Referring to FIG. 20B, a photomask with a plurality of round or polygonal holes (labeled d2) in the area corresponding to a semi-transparent part H2 between the source part S2 and the drain part D2 controls a light to form a photoresist pattern 54 as shown in FIG. 7B corresponding to the channel area C.

Referring to FIG. 20C, a photomask with at least one slit d3 in the area corresponding to a semi-transparent part H3 along the channel of TFT controls a light to form a photoresist pattern 54 corresponding to the channel area C.

Referring to FIG. 20D, a photomask with a plurality of bars d4 between the source part S4 and the drain part D4 controls a light to form a photoresist pattern 54 corresponding to the channel area C.

Although the invention has been described with reference to particular embodiments, the description is an example of the invention's application and should not be taken as a limitation. Various adaptations and combinations of the features of the embodiments disclosed are within the scope of the invention as defined by the following claims.

What is claimed is:

1. A method for manufacturing a TFT array panel comprising:
    forming a gate line having a gate electrode on an insulating substrate;
    forming a gate insulating layer over the gate line;
    forming a semiconductor layer over the gate insulating layer;
    forming an ohmic contact layer over the semiconductor layer;
    forming a data line having a source electrode and a drain electrode apart from each other over the ohmic contact layer by photolithography using a negative photoresist pattern;
    forming a passivation layer over the data line and having a contact hole to expose the drain electrode;
    forming a pixel electrode connected to the drain electrode through the contact hole,
    wherein the negative photoresist pattern includes a first portion having a first thickness in the area corresponding to a channel area between the source electrode and the drain electrode, a second portion having a second thickness thicker than the first thickness in the area corresponding to the data line area, and a third portion having a third thickness thinner than the first thickness in an area other than the channel area and the data line area, and
    wherein portions of the negative photoresist pattern that are exposed to light remain and have an inverse tapered lateral side,
    wherein a boundary line of the data line and the drain electrode is located in a boundary line of the semiconductor within the range of 1.25 μm and less, except for the distance between the source electrode and the drain electrode.

2. The method of claim 1, wherein a photomask used in the photolithography includes a transparent part where light penetrates completely, a semi-transparent part where a portion of light penetrates, and an opaque part where no light penetrates.

3. The method of claim 2, wherein the semi-transparent part, transparent part, and the opaque pan of the photomask are aligned to correspond to the first portion, the second portion, and the third portion of the negative photoresist pattern, respectively.

4. The method of claim 2, wherein the photomask includes a pattern that is smaller than the resolution of a light exposure device used in the photolithography.

5. The method of claim 4, wherein the pattern includes at least one of a slit, a round shape, a polygonal shape, and a plurality of bars.

6. The method of claim 1, wherein the data line, the drain electrode, the ohmic contact layer, and the semiconductor layer are formed by a single photomask.

7. The method of claim 6, wherein forming the semiconductor layer, the ohmic contact layer, the data line, and the drain electrode comprises:

forming an intrinsic semiconductor, a doped semiconductor, and a conductive layer;

forming a negative photoresist on the conductive layer;

exposing the photoresist through the photomask;

developing the photoresist to form the second portion in the area corresponding to the data line and the drain electrode;

etching the conductive layer, the underlying doped semiconductor and the intrinsic semiconductor corresponding the third portion of the photoresist, the first portion of the photoresist, the underlying conductive layer and doped semiconductor, and a portion of the second portion of the photoresist; and removing the photoresist pattern.

8. The method of claim 7, wherein forming the data line, the drain electrode, the ohmic contact layer and the semiconductor comprises:

etching the conductive layer corresponding to the third portion to expose the doped semiconductor;

etching the doped semiconductor and the underlying intrinsic semiconductor along with the first portion using a dry etching to expose the gate insulating layer corresponding to the third portion and the conductive layer corresponding to the first portion; and etching the conductive layer corresponding to the first portion and the underlying doped semiconductor.

9. The method of claim 8, wherein the conductive layer is etched by a wet etching process.

* * * * *